United States Patent
Park et al.

(10) Patent No.: US 7,843,750 B2
(45) Date of Patent: Nov. 30, 2010

(54) SEMICONDUCTOR MEMORY DEVICE COMPRISING TRANSISTOR HAVING VERTICAL CHANNEL STRUCTURE

(75) Inventors: Duk-Ha Park, Suwon-si (KR); Ki-Whan Song, Gangnam-gu (KR); Jin-Young Kim, Dobong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 408 days.

(21) Appl. No.: 11/797,867

(22) Filed: May 8, 2007

(65) Prior Publication Data

US 2009/0103343 A1    Apr. 23, 2009

Related U.S. Application Data

(60) Provisional application No. 60/812,107, filed on Jun. 9, 2006.

(30) Foreign Application Priority Data

Sep. 5, 2006    (KR)  ....................  10-2006-0085270

(51) Int. Cl.
G11C 7/00    (2006.01)
(52) U.S. Cl. ................... 365/203; 365/51; 365/204; 365/230.02; 365/230.06
(58) Field of Classification Search ............... 365/51, 365/230.06, 230, 72, 203, 204, 230.02, 185.11
See application file for complete search history.

(56) References Cited

U.S. PATENT DOCUMENTS

| | | | | |
|---|---|---|---|---|
| 5,349,560 A | * | 9/1994 | Suh et al. ................. | 365/203 |
| 5,379,248 A | * | 1/1995 | Wada et al. ............... | 365/63 |
| 5,381,373 A | * | 1/1995 | Ohsawa ................... | 365/201 |
| 6,337,820 B1 | * | 1/2002 | Hatakeyama ............. | 365/201 |
| 2003/0151966 A1 | | 8/2003 | Demone | |

FOREIGN PATENT DOCUMENTS

| | | |
|---|---|---|
| JP | 2002289815 A | 10/2002 |
| KR | 101998074778 | 11/1998 |
| KR | 1020010085740 A | 9/2001 |
| KR | 1020040074004 A | 8/2004 |
| KR | 1020050086130 A | 8/2005 |
| KR | 1020060041415 A | 5/2006 |
| KR | 1020060048699 A | 5/2006 |
| KR | 1020060062748 A | 6/2006 |

\* cited by examiner

*Primary Examiner*—Pho M Luu
*Assistant Examiner*—Tha-O Bui
(74) *Attorney, Agent, or Firm*—Volentine & Whitt, PLLC

(57) ABSTRACT

A semiconductor memory device including a transistor having a vertical channel structure is provided. The device includes a first sub memory cell array including a first memory cell connected to a first bit lines and including a transistor having a vertical channel structure, a second sub memory cell array including a second memory cell connected to a first inverted bit lines and including a transistor having a vertical channel structure, and a plurality of precharge blocks. In addition, first and second precharge blocks are disposed at first and second sides of the first bit line and precharge the first bit line, and third and fourth precharge blocks are disposed at first and second sides of the first inverted bit line and precharge the first inverted bit line.

22 Claims, 14 Drawing Sheets

SEMICONDUCTOR MEMORY DEVICE COMPRISING TRANSISTOR HAVING VERTICAL CHANNEL STRUCTURE

This application claims priority to Provisional U.S. Patent Application No. 60/812,107, filed Jun. 9, 2006, and to Korean Patent Application No. 10-2006-0085270, filed Sep. 5, 2006. The collective subject matter of these priority documents is hereby incorporated by reference.

BACKGROUND OF THE INVENTION

1. Field of the Invention

Embodiments of the invention relate to a semiconductor memory device. In particular, embodiments of the invention relate to a semiconductor memory device comprising a MOS transistor having a vertical channel structure.

2. Description of the Related Art

Conventional Metal-Oxide Semiconductor (MOS) transistors that each have a vertical channel structure can be arranged more densely (i.e., can be more densely integrated) than MOS transistors that each have a horizontal channel structure. Thus, techniques have been developed for fabricating a memory cell having a MOS transistor having a vertical channel structure for use in the fabrication of semiconductor memory devices having relatively high storage capacities and relatively high degrees of integration.

FIGS. 1A and 1B illustrate a conventional structure of dynamic memory cells each including a transistor having a vertical channel structure. Figure (FIG.) 1A is a perspective view of the conventional structure of dynamic memory cells, and FIG. 1B is a cross-sectional view of the structure illustrated in FIG. 1A taken along line X-X'.

The dynamic memory cells illustrated in FIGS. 1A and 1B comprise a P-type semiconductor substrate 10, cylindrical P-type channels 12 disposed on P-type semiconductor substrate 10 in a matrix and separated from one another, and N+-type gates 14 surrounding channels 12, respectively. The dynamic memory cells illustrated in FIGS. 1A and 1B further comprise N+-type drains 16 disposed under channels 12, respectively, and disposed, at least in part, between adjacent channels 12, wherein N+-type drains 16 disposed along a bit line direction are connected to one another. In addition, the dynamic memory cells still further comprise N+-type sources 18 formed on channels 12, respectively; word lines 22 surrounding N+-type gates 14, respectively, and connecting N+-type gates 14 that are adjacent to one another along a word line direction; cylindrical storage electrodes 24 disposed on and connected to sources 18, respectively; bar-shaped plate electrodes 26 insulated from and disposed partially in cylindrical storage electrodes 24; and a plate-shaped electrode 28 that makes contact with (i.e., commonly contacts) plate electrodes 26. Though it is not illustrated, N+-type drains 16 are used as bit lines.

The structure illustrated in FIGS. 1A and 1B is based on Korean Patent Publication No. 2006-41415.

FIG. 1C illustrates an equivalent circuit of the dynamic memory cell structure of FIGS. 1A and 1B. A memory cell MC including an NMOS transistor N and a capacitor C is disposed corresponding to each crossing of one of word lines WLi, WLi+1 and WLi+2 and one of bit lines BLi, BLi+1 and BLi+2. Each NMOS transistor N comprises a channel 12, a gate 14, a drain 16, and a source 18 (see FIGS. 1A and 1B). In addition, each capacitor C comprises a storage electrode 24 and a plate electrode 26 (see FIGS. 1A and 1B).

In each dynamic memory cell of the conventional memory device illustrated in FIGS. 1A, 1B, and 1C, since NMOS transistor N is formed having a vertical channel structure, and capacitor C is formed on NMOS transistor N, the memory device may have a higher degree of integration than a conventional semiconductor memory device including dynamic memory cells using a transistor having a horizontal channel structure.

FIG. 2 illustrates an arrangement of a conventional semiconductor memory device. The conventional memory device comprises a memory cell array 50, a column decoder 52, and a row decoder 54. Memory cell array 50 comprises sub memory cell arrays SMCA, sense amplifier blocks SA, sub word line drivers SWD, and junctions CJ. In addition, each sense amplifier block SA includes a precharge circuit P, and each sub word line driver SWD includes a driver D.

In FIG. 2, PX denotes a representative word line selection signal, NWL denotes a representative main word line signal, CSL denotes a representative column selection signal, WL denotes a representative word line, BL1 and BL1B denote a representative pair of bit lines having a folded bit line structure, and BL2 and BL2B denote a representative pair of bit lines having an open bit line structure. In practice, the folded bit line structure and open bit line structure illustrated in FIG. 2 are not used together in the same semiconductor memory device; however, they are illustrated together here for convenience.

Functions of the blocks illustrated in FIG. 2 will now be described. Sub memory cell array SMCA includes a memory cell MC connected between a word line WL and a bit line BL and stores data. Sense amplifier block SA amplifies data apparent on a bit line BL and data apparent on an inverted bit line (not illustrated). In addition, each sense amplifier block SA includes a precharge circuit P. When the bit lines have the folded bit line structure, bit line pair BL1 and BL1B of a corresponding sub memory cell array SMCA are each precharged by a respective precharge circuit P disposed at one side of the corresponding sub memory cell array SMCA. Likewise, when the bit lines have the open bit line structure in which bit line BL2 and inverted bit line BL2B for a bit line pair BL2 and BL2B, bit line BL2 corresponding to a first sub memory cell array SMCA is precharged by a precharge circuit P disposed at one side of the first sub memory cell array SMCA, and inverted bit line BL2B corresponding to a second sub memory cell array SMCA is precharged by precharge circuit P disposed at one side of the second sub memory cell array SMCA.

In addition, each sub word line driver SWD combines word line selection signal PX and main word line signal NWL to select a corresponding word line WL of the corresponding memory cell array SMCA. Junction CJ includes a driver (not illustrated) to drive word line selection signal PX. Column decoder 52 decodes a column address CA in response to a write signal WR and a read signal RD (which are not shown) and generates column selection signals CSL1 to CSLm (a generic column selection signal CSL is shown). Row decoder 14 decodes a first row address RA1 in response to an active signal ACT (not shown) and generates word line selection signal PX, and also decodes a second row address RA2 and generates main word line selection signal NWL.

FIG. 3 illustrates an arrangement of components of a sense amplifier block SA of FIG. 2. In particular, FIG. 3 illustrates an arrangement of a sense amplifier block SA of FIG. 2 having a rotated sense amplifier structure for k bit line pairs BL1, BL1B to BLk, BLkB (where k is a positive integer). Sense amplifier block SA comprises sub sense amplifiers SA1 to SAk and precharge circuits P1 to Pk, which are connected to bit line pairs BL1, BL1B to BLk, BLkB, respectively. Sense amplifier block SA also comprises column selection gates CSG, which, in FIG. 3, are respectively disposed at first and second sides of sense amplifier block SA. As illustrated in FIG. 3, sub sense amplifiers SA1 to SAk are disposed between column selection gates CSG and are divided into two groups of k/2 sub sense amplifiers. Sub sense amplifiers SA1 to SA(k/2) of a first group of sub sense amplifiers are disposed adjacent to one another along a first dimension, and sub sense amplifiers SA(k/2+1) to SAk are also disposed adjacent to one another along the first dimension. In addition, the sub sense amplifiers of the first group are disposed adjacent to the sub sense amplifiers of the second group along a second dimension orthogonal to the first dimension. Also, k/2 precharge circuits P1 to P(k/2) are disposed adjacent to k/2 sub sense amplifiers SA1 to SA(k/2) (i.e., the sub sense amplifiers of the first group), respectively, and another k/2 precharge circuits P(k/2+1) to Pk are disposed adjacent to another k/2 sub sense amplifiers SA(k/2+1) to SAk (i.e., the sub sense amplifiers of the second group), respectively. In addition, sub sense amplifiers SA1 to SAk are disposed between precharge circuits P1 to P(k/2) and precharge circuits P(k/2+1) and Pk. Each of precharge circuits P1 to Pk comprises three NMOS transistors (not illustrated).

When sense amplifier block SA of the conventional semiconductor memory device illustrated in FIG. 2 has a rotated sense amplifier structure, a first-dimensional length d of a region in which one of precharge circuits P1 to Pk (including three NMOS transistors) is disposed limits the amount by which a first-dimensional length of sense amplifier block SA may be reduced. That is, even though the first-dimensional length of each of sub sense amplifiers SA1 to SAk could be made smaller than first-dimensional length d, the first-dimensional length d of each region in which one of precharge circuits P1 to Pk is disposed limits reduction of the layout area of sense amplifier block SA. As used herein, a "first-dimensional" length is a length along the first dimension.

Also, when a memory cell using the NMOS transistor having the vertical channel structure illustrated in FIGS. 1A, 1B, and 1C is used in the conventional memory device illustrated in FIG. 2, parasitic components of the bit line and the word line grow larger, so operational characteristics of the device may deteriorate.

For example, as the parasitic components of bit line BL1 of FIG. 2 grow larger, it takes more time to precharge bit line BL1 to a precharge voltage level using the corresponding precharge circuit P of FIG. 2. And, as the parasitic components of word line WL grow larger, it takes more time to drive word line WL to a desirable level using sub word line driver D of FIG. 2. While the size of driver D may be increased in order to increase the ability of sub word line driver SWD to drive word line WL (i.e., to enhance drivability of the sub word line driver), increasing the size of driver D may not be a desirable solution because it increases the overall area of the device.

Thus, a new arrangement of components (i.e., structure) of a semiconductor memory device including a memory cell using an NMOS transistor having a vertical channel structure is required.

SUMMARY OF THE INVENTION

Embodiments of the invention provide a semiconductor memory device comprising a memory cell having a vertical channel transistor, wherein components of the memory device are arranged such that parasitic components of a bit line and a word line may be reduced.

In one embodiment, the invention provides a semiconductor memory device comprising a first sub memory cell array comprising a plurality of first memory cells connected to a first plurality of word lines and a plurality of bit lines, wherein each first memory cell comprises at least one transistor having a vertical channel structure; a second sub memory cell array comprising a plurality of second memory cells connected to a second plurality of word lines and a plurality of inverted bit lines, wherein each second memory cell comprises at least one transistor having a vertical channel structure; and a precharge portion disposed at both sides of each bit line and each inverted bit line and precharging each bit line and each inverted bit line to a precharge voltage level at both sides thereof. In addition, the precharge portion comprises first and second precharge blocks disposed at first and second sides of a first bit line of the plurality of bit lines, respectively, wherein the first and second precharge blocks precharge the first bit line to a precharge voltage level at the first and second sides of the first bit line, respectively; and third and fourth precharge blocks disposed at first and second sides of a first inverted bit line of the plurality of inverted bit lines, respectively, wherein the third and fourth precharge blocks precharge the first inverted bit line to the precharge voltage level at the first and second sides of the first inverted bit line, respectively.

In another embodiment, the invention provides a semiconductor memory device comprising a first sub memory cell array comprising a plurality of memory cells connected to a plurality of main word lines and a plurality of bit line pairs, wherein each bit line pair comprises a bit line of a plurality of bit lines and an inverted bit line of a plurality of inverted bit lines, and each memory cell comprises at least one transistor having a vertical channel structure; and a precharge portion disposed at both sides of each bit line and inverted bit line of the plurality of bit line pairs and precharging the bit lines and inverted bit lines to a precharge voltage level at both sides thereof. The precharge portion comprises a first precharge block disposed at a first side of a first bit line of the plurality of bit lines and a first side of a first inverted bit line of the plurality of inverted bit lines, wherein the first precharge block precharges the first bit line to a precharge voltage level at the first side of the first bit line and precharges the first inverted bit line to the precharge voltage level at the first side of the first inverted bit line. The precharge portion further comprises a second precharge block disposed at a second side of the first bit line and a second side of the first inverted bit line, wherein the second precharge block precharges the first bit line to the precharge voltage level at the second side of the first bit line and precharges the first inverted bit line to the precharge voltage level at the second side of the inverted bit line.

In yet another embodiment, the invention provides a semiconductor memory device comprising a memory cell array comprising a first sub memory cell array comprising a plurality of first memory cells connected to a first plurality of divided word lines and a plurality of bit lines, wherein each first memory cell comprises at least one transistor having a vertical channel structure; and a second sub memory cell array comprising a plurality of second memory cells connected to a second plurality of divided word lines and a plurality of inverted bit lines, wherein each second memory cell comprises at least one transistor having a vertical channel structure. The memory cell array further comprises a precharge portion disposed at both sides of each bit line and each inverted bit line and precharging each bit line and each inverted bit line to a precharge voltage level at both sides thereof, wherein the precharge portion comprises precharge blocks disposed at first and second sides of a first bit line of the plurality of bit lines and at first and second sides of a first inverted bit line of the plurality of inverted bit lines, precharge the first bit line to a precharge voltage level at the first and second sides of the first bit line, and precharge the first inverted bit line to the precharge voltage level at the first and second sides of the first inverted bit line. In addition, the semiconductor memory device further comprises a row address decoder, wherein the row address decoder generates a decoded row address signal by decoding a row address and outputs the decoded row address signal; and a word line driver, wherein the word line driver receives the decoded row address signal and drives at least one main word line of a plurality of main word lines connected to the first and second sub memory cell arrays.

In still another embodiment, the invention provides a semiconductor memory device comprising a memory cell array comprising a plurality of sub memory cell arrays comprising a plurality of memory cells connected to a plurality of divided word lines and a plurality of bit line pairs; a precharge portion precharging the plurality of bit line pairs to a precharge voltage level by precharging the plurality of bit line pairs at first and second sides of the sub memory cell arrays; and a first sense amplifier block amplifying a voltage difference of a first bit line and a first inverted bit line of a first bit line pair of the plurality of bit line pairs and comprising first and second precharge blocks of the plurality of precharge blocks. In addition, at least a portion of the first sense amplifier block is disposed between the first and second precharge blocks, the bit line pairs extend along a first dimension and the divided word lines extend along a second dimension orthogonal to the first dimension, and the sense amplifier block and a first sub memory cell array of the plurality of memory cell arrays are separated along the first dimension. Also, the first and second precharge blocks and the first sub memory cell array are disposed along the first dimension, a second sub memory cell array of the plurality of memory cell arrays is separated from the first sub memory cell array along the second dimension; a third precharge block of the plurality of precharge blocks is separated from the first precharge block along the second dimension, and a second sense amplifier block is separated from the first sense amplifier block along the second dimension. Also, the semiconductor memory device further comprises a row address decoder, wherein the row address decoder generates a decoded row address signal by decoding a row address and outputs the decoded row address signal; and a word line driver, wherein the word line driver receives the decoded row address signal and drives at least one main word line of a plurality of main word lines connected to the sub memory cell arrays.

BRIEF DESCRIPTION OF THE DRAWINGS

Embodiments of the invention will be described herein with reference to the accompanying drawings, in which.

DESCRIPTION OF EMBODIMENTS

A semiconductor memory device, in accordance with embodiments of the invention, comprising a transistor having a vertical channel structure will now be described with reference to the accompanying drawings. Like reference symbols indicate like or similar elements throughout. In addition, the drawings are not necessarily drawn to scale. Also, as used herein, when a first component is said to be "on" a second component, the first component may be directly on the second component, or intervening components may be present. Alternatively, if a first component is said to be "directly on" a second component, then no intervening components are present. In addition, as used herein, when a memory cell is said to be connected to a bit line pair, it means that the memory cell is connected either to the bit line or the inverted bit line of the bit line pair. Also, as used herein, "vertical" means perpendicular to the working surface of a corresponding substrate, and "horizontal" means a dimension orthogonal to the vertical dimension. Multiple of the same element or component may be illustrated in a drawing, and multiple pluralities of an element or component may be illustrated in a drawing. However, the description may only include description of representative elements, components, or pluralities thereof where multiple are illustrated.

Figure 4:
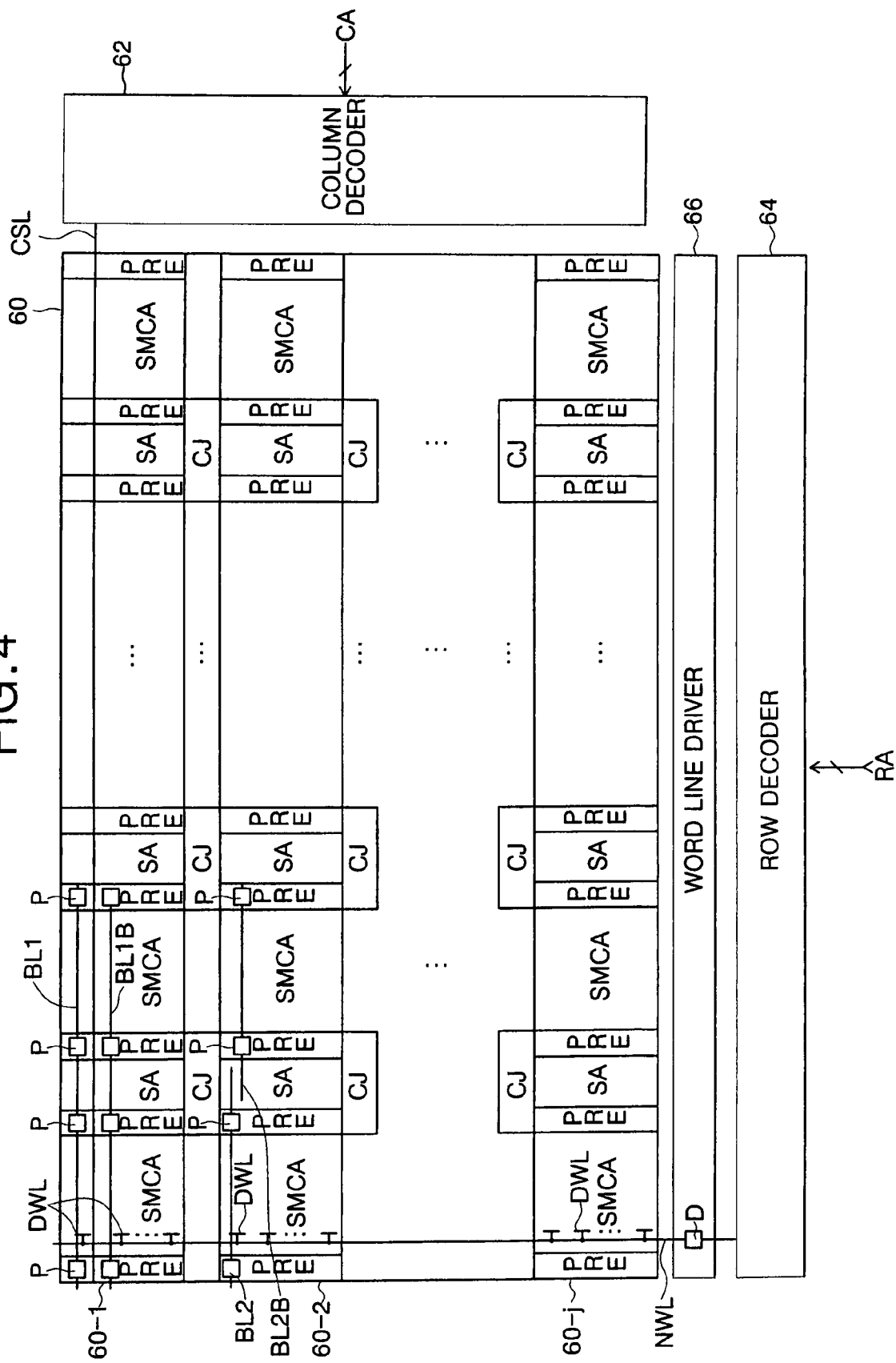
FIG. 4 illustrates an arrangement of components of semiconductor memory device in accordance with an embodiment of the invention.

FIG. 4 illustrates an arrangement of components of a semiconductor memory device in accordance with an embodiment of the invention. In particular, FIG. 4 illustrates a structure of one memory cell array bank in accordance with an embodiment of the invention.

The semiconductor memory device illustrated in FIG. 4 comprises a memory cell array 60, a column decoder 62, a row decoder 64, and a word line driver 66. Memory cell array 60 comprises sub memory cell arrays SMCA, sense amplifier blocks SA, and junctions CJ. Each sense amplifier block SA comprises a plurality of precharge blocks PRE, and each precharge block PRE comprises a precharge circuit P. Word line driver 66 comprises a driver D. In addition, a "row decoder" may also be referred to herein as a "row address decoder".

In FIG. 4, CSL denotes a representative column selection signal, NWL denotes a representative main word line, and DWL denotes a divided word line. In addition, BL1 and BL1B denote a representative pair of bit lines having a folded bit line structure, and BL2 and BL2B denote a representative pair of bit lines having an open bit line structure. Though the folded bit line structure and the open bit line structure illustrated in FIG. 4 are generally not used together in a single semiconductor memory device, they are illustrated together herein for convenience.

The arrangement of components of the semiconductor memory device illustrated in FIG. 4 will now be described in more detail.

Column decoder 62 is disposed on a first side of memory cell array 60 and extends along the same dimension (i.e., in the same direction) as main word line NWL extends. Row decoder 64 is disposed on a second side of memory cell array 60 and extends along the same dimension as column selection signal line CSL extends. Main word line NWL and divided word line DWL are disposed along the same dimension. In addition, each bit line of bit line pair BL1 and BL1B and bit line pair BL2 and BL2B extends along the same dimension as column selection signal line CSL extends, and column selection line CSL is perpendicular to main word line NWL. Memory cell array 60 comprises memory cell array blocks 60-1 to 60-j, which are disposed adjacent to one another along a first dimension, and each of memory cell array blocks 60-1 to 60-j comprises sub memory cell arrays SMCA and sense amplifier blocks SA. In addition, junctions CJ are interposed between adjacent memory cell array blocks of memory cell array blocks 60-1 to 60-j. As used herein, when an element or component is said to "extend" along a first dimension it means that the length of that element or component along the first dimension is longer than the length of that element or component along a second dimension orthogonal to the first dimension. Also, as an example, if a first bit line is disposed along (i.e., extends along) a first dimension, and a second bit line is parallel to the first bit line, then the second bit line is also disposed along (i.e., extends along) the first dimension.

Figure 2:
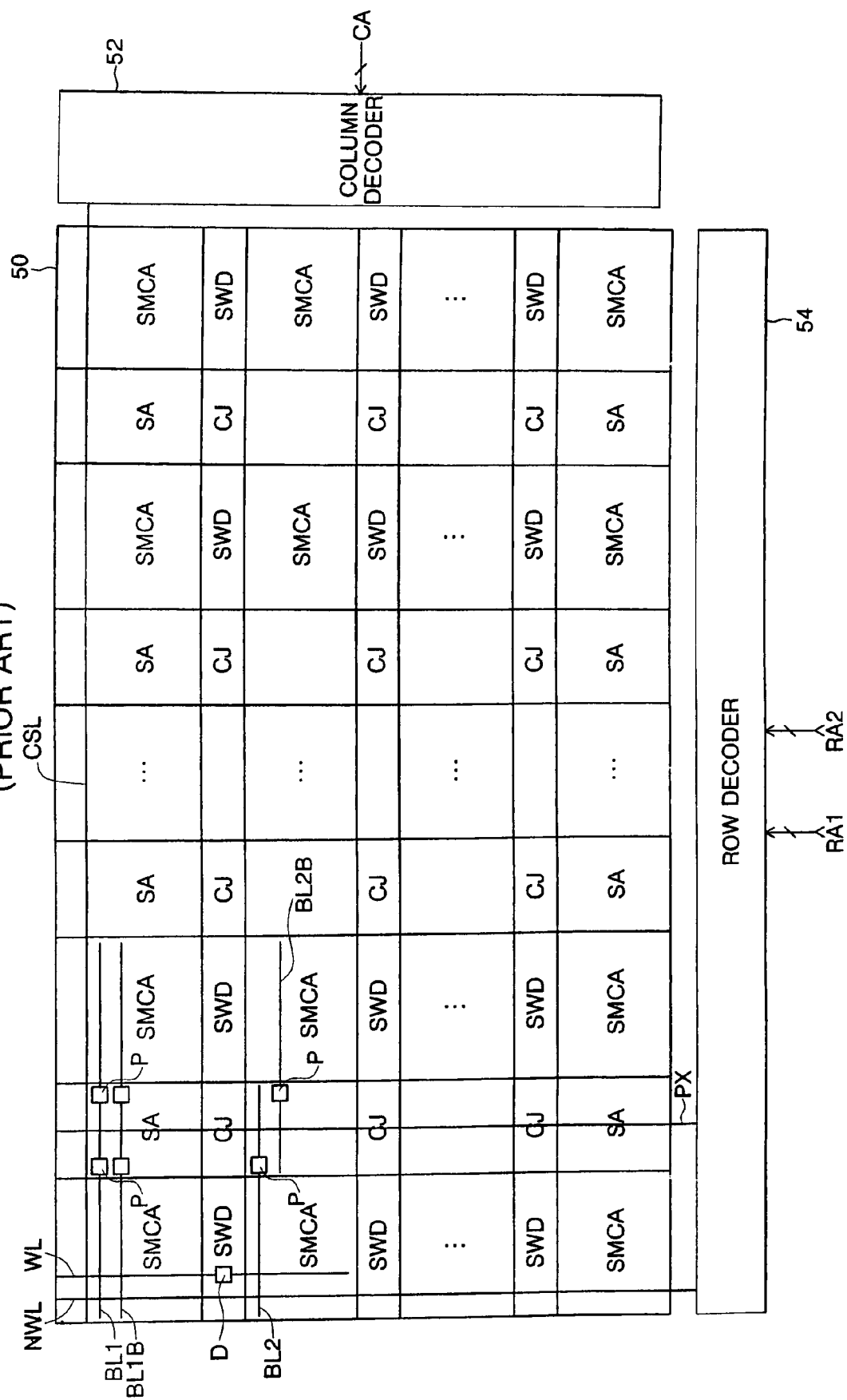
FIG. 2 illustrates an arrangement of components of a conventional semiconductor memory device.

Unlike the semiconductor memory device illustrated in FIG. 2, the semiconductor memory device illustrated in FIG. 4 does not comprise the sub word line drivers SWD of FIG. 2 between adjacent memory cell array blocks of memory cell array blocks 60-1 to 60-j. In addition, a plurality of divided word lines DWL connected to main word line NWL are disposed in each sub memory cell array SMCA. Precharge circuits P of precharge blocks PRE are disposed on two sides of each sub memory cell array SMCA. In the conventional semiconductor memory device of FIG. 2, each bit line of a sub memory cell array SMCA is precharged by only one precharge circuit P disposed on one side of the sub memory cell array SMCA. However, in the embodiment illustrated in FIG. 4, each bit line of a sub memory cell array SMCA is precharged by two precharge circuits P, which are disposed on two sides of each sub memory cell array SMCA, respectively.

Elements of the semiconductor memory device of FIG. 4 will be described below, but description of elements (i.e., blocks) that are like or similar to elements described above with reference to FIG. 2 may be omitted here.

Row decoder 64 generates a decoded row address signal (i.e., a decoded row address) by decoding a row address RA. Row decoder 64 outputs the decoded row address signal and word line driver 66 receives the decoded row address signal. Driver D responds to the decoded row address signal and drives main word line NWL, and thereby word line driver 66 drives main word line NWL. Precharge circuits P of precharge blocks PRE precharge each of the bit lines BL1, BL1B, BL2 and BL2B to a precharge voltage level at both sides of the bit lines BL1, BL1B, BL2 and BL2B.

In the embodiment illustrated in FIG. 4, parasitic resistance of the word line (i.e., main word line NWL) is relatively low (i.e., is decreased) because of the plurality of divided word lines DWL disposed in each sub memory cell array SMCA. Thus, the semiconductor memory device of the embodiment illustrated in FIG. 4 is capable of rapidly driving a word line to a desired level. Additionally, the semiconductor memory device illustrated in FIG. 4 is capable of rapidly precharging bit lines BL1, BL1B, BL2, and BL2B to a desired precharge voltage level even if the parasitic resistance of one of those bit lines is relatively high (i.e., is increased) because each of bit lines BL1, BL1B, BL2, and BL2B is precharged by two precharge circuits P. Accordingly, the operational characteristics of the device do not substantially deteriorate due to using transistors that each have a vertical channel structure.

Figure 5:
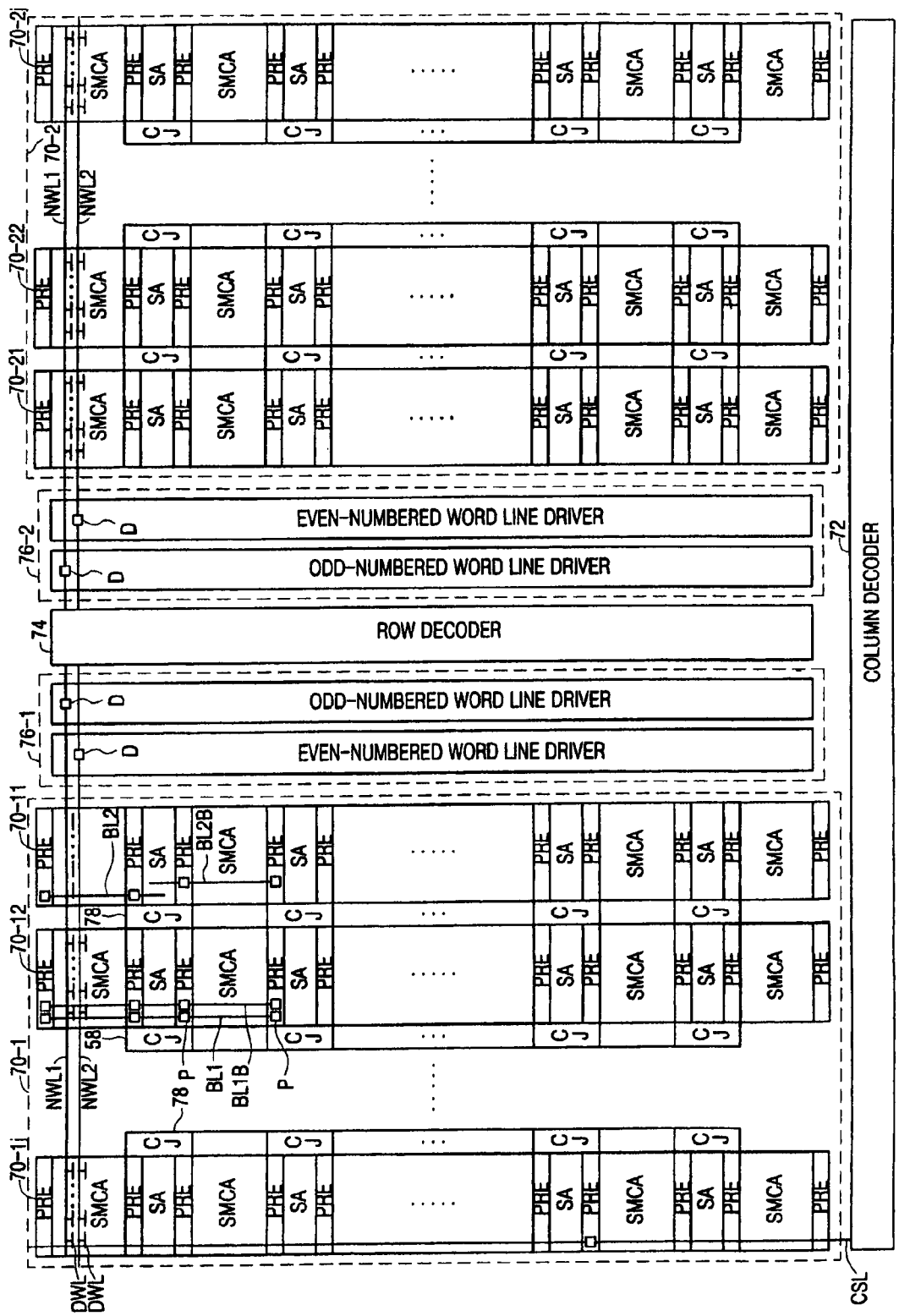
FIG. 5 illustrates an arrangement of components of a semiconductor memory device in accordance with another embodiment of the invention.

FIG. 5 illustrates an arrangement of components of a semiconductor memory device in accordance with another embodiment of the invention. In particular, FIG. 5 illustrates a structure of one memory cell array bank.

The semiconductor memory device illustrated in FIG. 5 comprises first and second memory cell arrays 70-1 and 70-2, a column decoder 72, a row decoder 74, and first and second word line drivers 76-1 and 76-2. Each of first and second memory cell arrays 70-1 and 70-2 comprises sub memory cell arrays SMCA, sense amplifier blocks SA, and junctions CJ. Each sense amplifier block SA comprises precharge blocks PRE, each of which comprise a precharge circuit P. First and second line drivers 76-1 and 76-2 each comprise an even-numbered word line driver and an odd-numbered word line driver. Each of the even-numbered word line drivers and the odd-numbered word line drivers comprises a driver D.

In FIG. 5, CSL denotes a representative column selection signal, NWL1 denotes a representative odd-numbered main word line of each of first and second memory cell arrays 70-1 and 70-2, NWL2 denotes a representative even-numbered main word line of each of first and second memory cell arrays 70-1 and 70-2, and DWL denotes a divided word line, wherein each divided word line DWL is disposed in a sub memory cell array SMCA. In addition, BL1 and BL1B denote a representative pair of bit lines having a folded bit line structure, and BL2 and BL2B denote a representative pair of bit lines having an open bit line structure. Although the folded bit line structure and the open bit line structure illustrated in FIG. 5 are generally not used together in the same semiconductor memory cell, they are illustrated together in FIG. 5 for convenience.

The structure of the semiconductor memory device illustrated in FIG. 5 will now be described. First memory cell array 70-1 and second memory cell array 70-2 are disposed separate from one another, and row decoder 74 is disposed between first and second memory cell arrays 70-1 and 70-2 and on a first side of each of first and second memory cell arrays 70-1 and 70-2. In addition, row decoder 74 and column selection signal line CSL extend along the same dimension. Column decoder 72 and main word line NWL1 extend along the same dimension and column decoder 72 is disposed on a second side of each of first and second memory cell arrays 70-1 and 70-2. First word line driver 76-1 extends along the same dimension as column selection signal line CSL and is disposed between row decoder 74 and first memory cell array 70-1. Additionally, second word line driver 76-2 extends along the same dimension as column selection signal line CSL and is disposed between row decoder 74 and second memory cell array 70-2. First and second memory cell arrays 70-1 and 70-2 each have the same structure (i.e., arrangement of components) as memory cell array 60 of FIG. 4. That is, first memory cell array 70-1 comprises memory cell array blocks 70-11 to 70-1j, and sub memory cell arrays SMCA and sense amplifier blocks SA are disposed in memory cell array blocks 70-11 to 70-1j. Also, second memory cell array 70-2 comprises memory cell array blocks 70-21 to 70-2j, and sub memory cell arrays SMCA and sense amplifier blocks SA are disposed in memory cell array blocks 70-21 to 70-2*j*. In addition, first and second memory cell arrays 70-1 and 70-2 each comprise junctions CJ. A junction CJ is disposed corresponding to each sense amplifier block SA, and each junction CJ is disposed between two adjacent memory cell array blocks of memory cell array blocks 70-11 to 70-1*j* or memory cell array blocks 70-21 to 70-2*j*. As illustrated in FIG. 5, a plurality of divided word lines DWL connected to odd main word line NWL1 (and a plurality of divided word lines DWL connected to even main word line NWL2) are disposed in each sub memory cell array SMCA. In addition, for each sub memory cell array SMCA, precharge blocks PRE are disposed on each of two opposite sides of the sub memory cell array SMCA.

In the semiconductor memory device illustrated in FIG. 5, because a plurality of divided word lines DWL are disposed in each sub memory cell array SMCA and are connected to a word line corresponding to the sub memory cell array SMCA, parasitic resistance of the word line to which divided word lines DWL are connected is relatively low (i.e., is decreased), so the semiconductor memory device illustrated in FIG. 5 can drive the word line to a desired level relatively quickly. Also, the semiconductor memory device illustrated in FIG. 5 can rapidly precharge a bit line disposed in the semiconductor memory device even if the parasitic resistance of the bit line is relatively high (i.e., is increased) since, like bit lines BL1, BL1B, BL2, and BL2B, each bit line in the semiconductor memory device is precharged by two precharge circuits P. Accordingly, operational characteristics of the device do not substantially deteriorate due to using transistors that each have a vertical channel structure.

Figure 6:
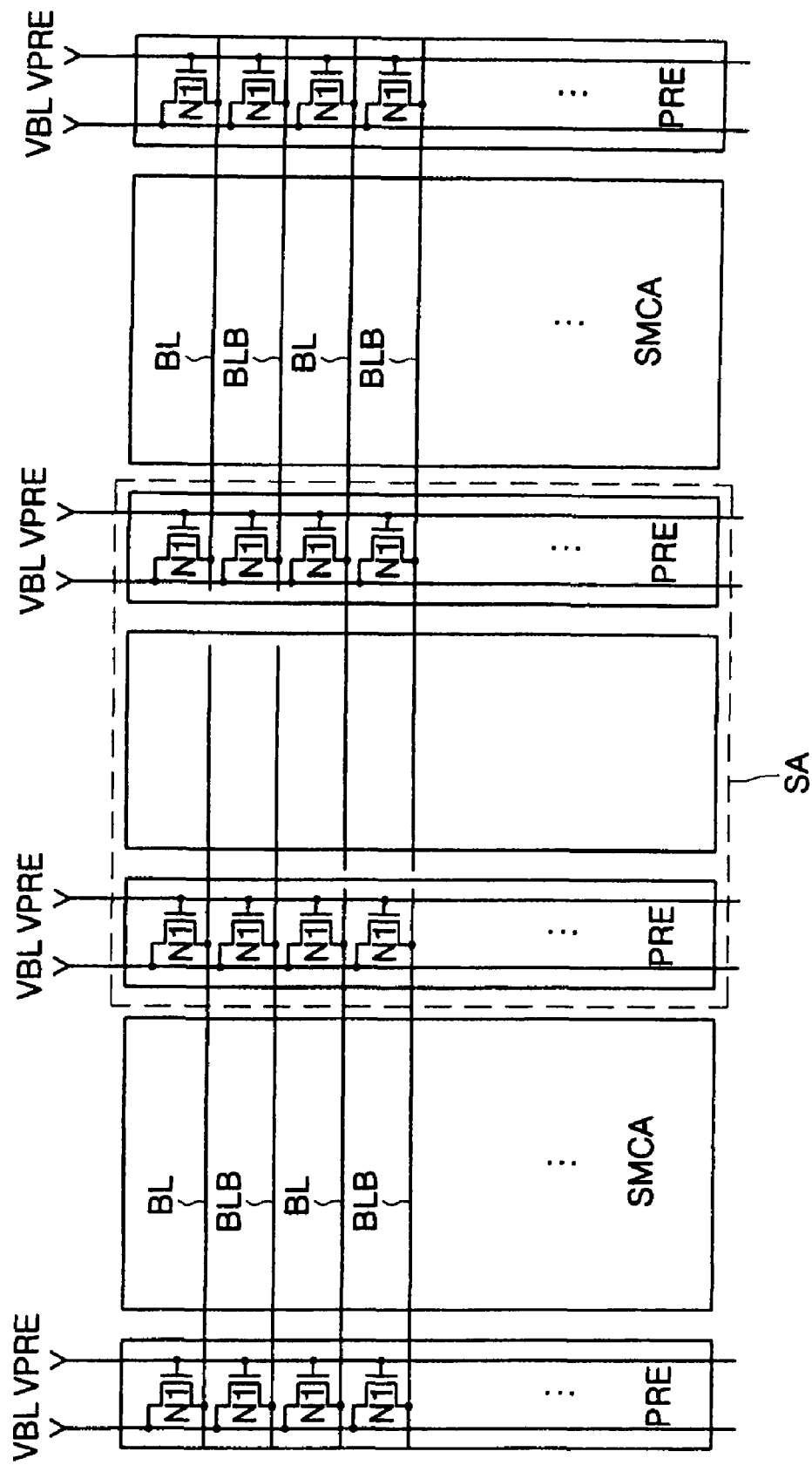
FIG. 6 illustrates a portion of a memory cell array block of a memory cell array of FIG. 4 and a memory cell array of FIG. 5.

FIG. 6 illustrates a structure of a precharge circuit of memory cell arrays illustrated in FIGS. 4 and 5. In particular, FIG. 6 illustrates a structure of a precharge circuit of a memory cell array wherein bit lines corresponding to the precharge circuit have a folded bit line structure.

As illustrated in FIG. 6, two precharge portions PRE (comprising precharge circuits P that each comprise an NMOS transistor N1) are disposed on two sides of each sub memory cell array SMCA, respectively. In addition, two precharge circuits P are disposed at two points of each bit line BL, respectively, and two precharge circuits P are disposed at two points of each inverted bit line BLB, respectively. In FIG. 6, precharge circuits P are implemented as NMOS transistors N1.

For each bit line BL, two precharge circuits P are respectively disposed at two points along the bit line BL and precharge the bit line BL to a precharge voltage level VBL at each of those two points along bit line BL. In addition, for each inverted bit line BLB, two precharge circuits P are respectively disposed at two points along the inverted bit line BLB and precharge the inverted bit line BLB to a precharge voltage level VBL at each of those two points along the inverted bit line BLB. A precharge circuit P precharges a corresponding bit line BL or a corresponding inverted bit line BLB when the NMOS transistor N1 of the precharge circuit P is turned ON in response to a precharge control signal VPRE.

Figure 7:
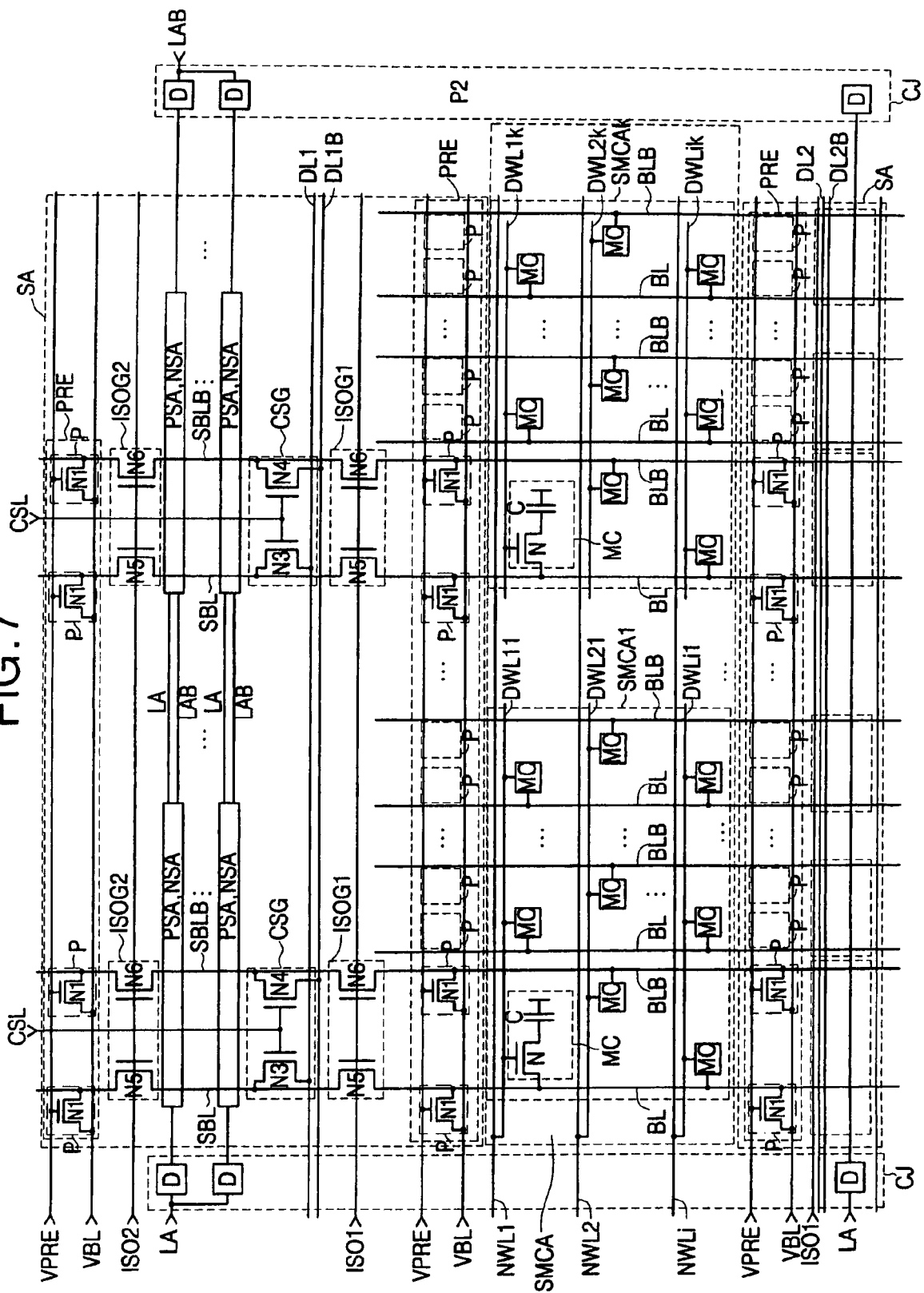
FIG. 7 illustrates an arrangement of components of a portion of the portion of a memory cell array block illustrated in FIG. 6.

FIG. 7 illustrates an arrangement of components of a portion of the portion of a memory cell array block illustrated in FIG. 6. As illustrated in FIG. 7, each sub memory cell array SMCA is divided into k sub memory cell array blocks SMCA1 to SMCAk (where k is a positive integer). In addition, there are i groups of k divided word lines (where i is a positive integer), wherein the i groups are DWLi1 to DWL1*k* through DWLi1 to DWLi*k*. That is, i*k divided word lines DWL11 to DWLik correspond to sub memory cell array SMCA. Also, each of i main word lines NWL1 to NWLi is connected to one of the groups of k divided word lines. For example, main word line NWL1 is connected to k divided word lines DWL11 to DWL1*k*, and main word line NWLi is connected to k divided word lines DWLi1 to DWLi*k*. Each sub memory cell array block SMCA1 to SMCAk comprises memory cells MC connected to a divided word line and one bit line of a bit line pair. For example, one memory cell MC of sub memory cell array block SMCA1 may be connected to divided word line DWL11 and a bit line BL of a bit line pair BL and BLB. In addition, in the portion of a semiconductor memory device illustrated in FIG. 7, two pairs of data bits may be input through and output through two data line pairs DL1, DL1B and DL2, DL2B, respectively. A data line may also be referred to as a data input/output line.

In the embodiment illustrated in FIG. 7, each memory cell MC comprises an NMOS transistor N having a vertical channel structure and a capacitor C (though they are not shown for every memory cell MC in FIG. 7). In addition, a sense amplifier block SA comprises precharge circuits P, first and second isolation gates ISOG1 and ISOG2, column selection gates CSG (i.e., data input/output gates CSG), and PMOS and NMOS sense amplifiers PSA and NSA. Each precharge circuit P comprises an NMOS transistor N1, each column selection gate CSG comprises NMOS transistors N3 and N4, and each of isolation gates ISOG1 and ISOG2 comprises NMOS transistors N5 and N6.

In the portion of a memory cell array block illustrated in FIG. 7, the bit lines are disposed in a folded bit line structure, and a plurality of PMOS and NMOS sense amplifiers PSA and NSA (i.e., selected PMOS and NMQS sense amplifiers PSA and NSA) of sense amplifier block SA are interposed between an illustrated sub memory cell array block SMCA1 and another sub memory cell array block SMCA1 that is not shown but is separated from the illustrated sub memory cell array block SMCA1 along a first dimension along which column selection signal line CSL and bit line pair BL and BLB extend. In addition, the plurality of PMOS and NMOS sense amplifiers PSA and NSA are disposed along the first dimension. That is, PMOS and NMOS sense amplifiers PSA and NSA of sense amplifier block SA have a rotated sense amplifier structure.

Functions of components illustrated in FIG. 7 will be described below. NMOS transistors N5 and N6 of first isolation gate ISOG1 are turned ON in response to first isolation control signal ISO1. When turned ON, first isolation gate ISOG1 connects a corresponding sense bit line pair SBL and SBLB and a corresponding bit line pair BL and BLB of sub memory cell array block SMCA1. NMOS transistors N5 and N6 of second isolation gate ISOG2 are turned ON in response to second isolation control signal ISO2. When turned ON, second isolation gate ISOG2 connects the corresponding sense bit line pair with a corresponding bit line pair of a sub memory cell array block (not illustrated) that is separated from sub memory cell array block SMCA1 along the dimension in which column selection signal CSL extends. NMOS sense amplifier NSA amplifies one line of the corresponding sense bit line pair to a ground voltage level in response to a ground voltage level signal LAB, and PMOS sense amplifier PSA amplifies one line of the corresponding sense bit line pair to a power voltage level in response to a power voltage level signal LA. Using PMOS and NMOS sense amplifiers PSA and NSA, sense amplifier block SA senses and amplifies a voltage difference between a bit line and an inverted bit line of a bit line pair.

In addition, an NMOS transistor N1 is turned ON in response to a precharge control signal VPRE, and a precharge circuit P precharges a corresponding bit line (of a bit line pair)

to a precharge voltage level VBL when the NMOS transistor N1 of that precharge circuit P is turned ON. In addition, when NMOS transistors N1 respectively disposed at both sides of a bit line are turned ON, both sides of that bit line are precharged. As used herein, a bit line being precharged at "both sides" means that is it precharged on a first side of a corresponding sub memory cell array SMCA and on a second side of the sub memory cell array opposite the first side. Precharge voltage level VBL may be a voltage level between the power voltage and the ground voltage. NMOS transistors N3 and N4 are turned ON in response to a column selection signal CSL, and when NMOS transistors N3 and N4 are turned ON, column selection gate CSG communicates data between a corresponding sense bit line pair and a corresponding data line pair. Though column selection gate CSG communicates data between a sense bit line pair and a data line pair, the sense bit line pair corresponds to a bit line pair, so it may be said that column selection gate CSG communicates data between the bit line pair (to which the sense bit line pair corresponds) and the data line pair. One driver D drives power voltage level signal LA applied to PMOS sense amplifier PSA and another driver D drives ground voltage level signal LAB applied to NMOS sense amplifier NSA.

Figure 8:
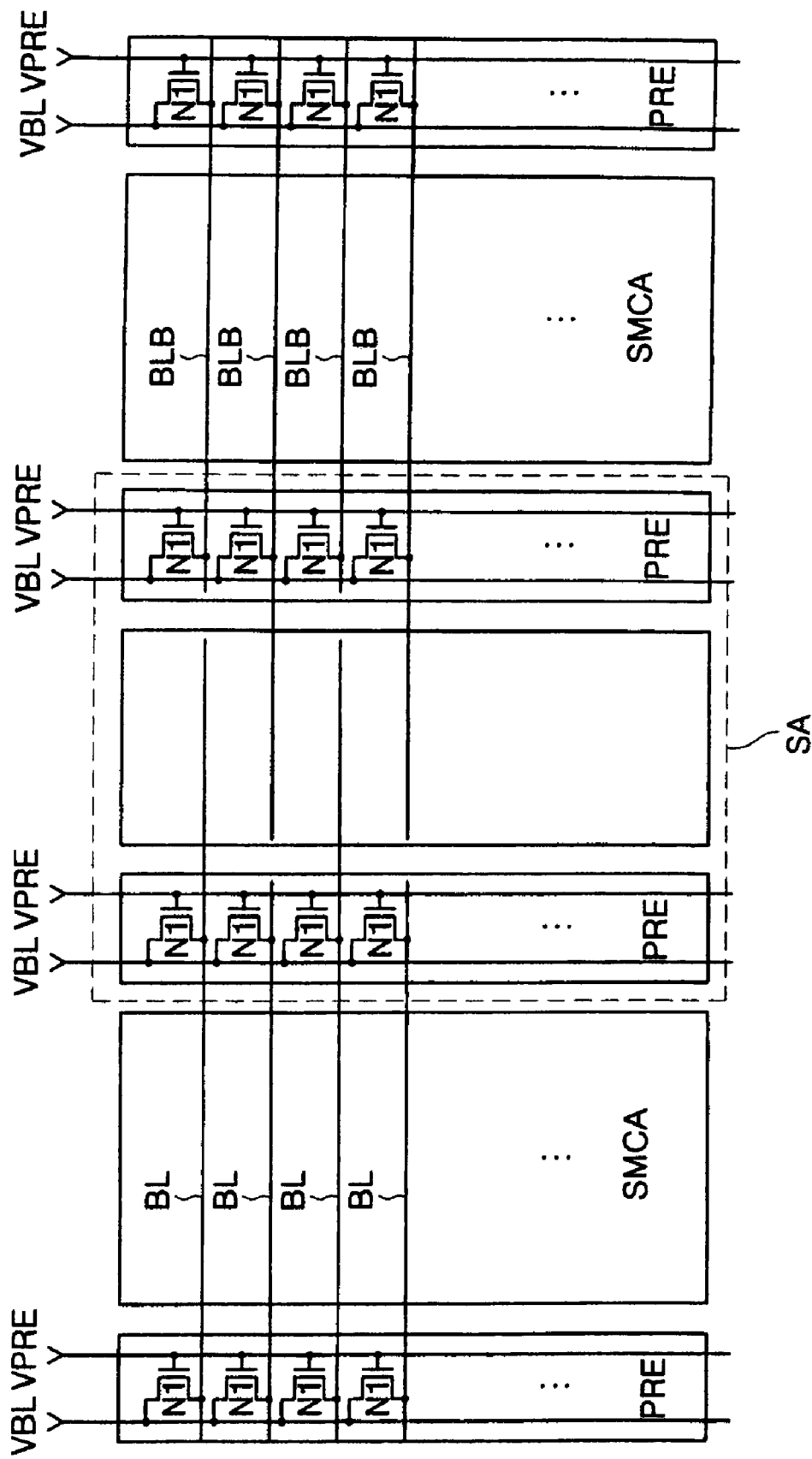
FIG. 8 illustrates a portion of another memory cell array block of each of the memory cell arrays of FIGS. 4 and 5, respectively.

FIG. 8 illustrates a portion of another memory cell array block of each of the memory cell arrays illustrated in FIGS. 4 and 5, respectively. In particular, FIG. 8 illustrates an arrangement of components (i.e., a structure) in which bit lines have an open bit line structure.

As illustrated in FIG. 8, two precharge blocks PRE comprising precharge circuits P that each comprise an NMOS transistor N1 are disposed on two sides of each sub memory cell array SMCA, respectively. In addition, two precharge circuits P are disposed at two points of each bit line BL, respectively, and two precharge circuits P are disposed at two points of each inverted bit line BLB, respectively. In the embodiment illustrated in FIG. 8, precharge circuits P are implemented as NMOS transistors N1, and have the same function as precharge circuits P (i.e., NMOS transistors N1) of FIG. 6.

Figure 9:
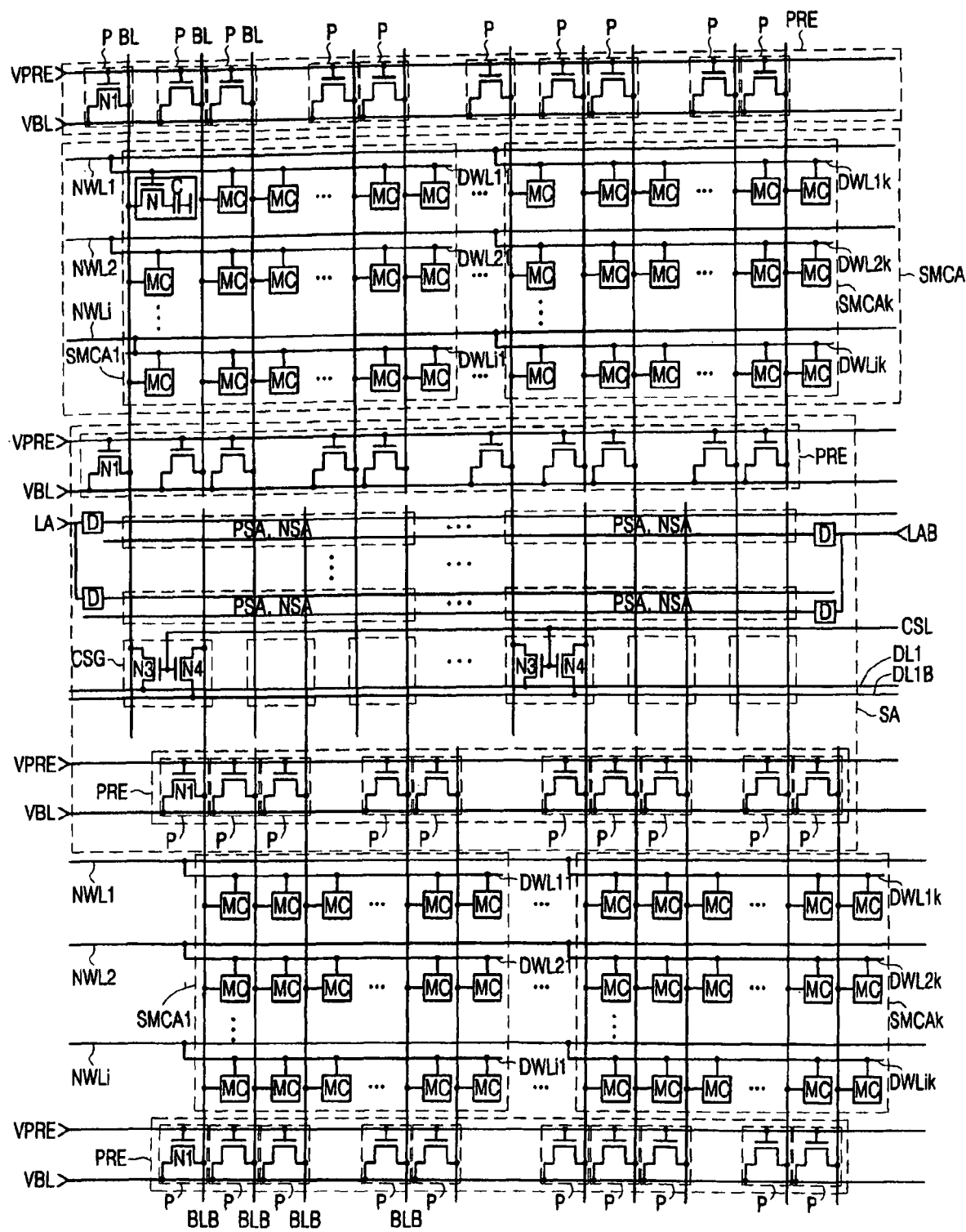
FIG. 9 illustrates a structure of the portion of the memory cell array block illustrated in FIG. 8.

FIG. 9 illustrates a structure of the portion of the memory cell array block illustrated in FIG. 8. In the embodiment illustrated in FIG. 9, sub memory cell array SMCA is divided into k sub memory cell array blocks SMCA1 to SMCAk, i main word lines NWL1 to NWLi correspond to sub memory cell array block SMCA, and i*k divided word lines DWL11 to DWLik correspond to sub memory cell array SMCA. Each of main word lines NWL1 to NWLi is connected to k divided word lines of divided word lines DWL11 to DWLik. For example, main word line NWL1 is connected to each of divided word lines DWL11 to DWL1*k* and main word line NWLi is connected to each of divided word lines DWLi1 to DWLik. Also, divided word lines DWL11 to DWLik may be described as being divided into divided word line groups comprising divided word line group DWL11 to DWL1*k* through divided word line group DWLi1 to DWLik.

In addition, each of sub memory cell array blocks SMCA1 to SMCAk comprises memory cells MC, wherein each memory cell MC is connected to one of divided word lines DWL11 to DWLik and a bit line BL (or an inverted bit line BLB if the sub memory cell array SMCA corresponds to inverted bit lines BLBs like the sub memory cell array SMCA illustrated at the lower portion of FIG. 9). Additionally, a pair of data bits may be input through or output through a data line pair DL1 and DL1B.

Also, the sub memory cell array SMCA illustrated at the upper portion of FIG. 9 may be referred to as a first sub memory cell array SMCA and the main word lines NWL1 to NWLi corresponding to the first sub memory cell array SMCA may be referred to as a first plurality of main word lines NWL1 to NWLi. In addition, the sub memory cell array SMCA illustrated at the lower portion of FIG. 9 may be referred to as a second sub memory cell array SMCA and the main word lines NWL1 to NWLi corresponding to the second sub memory cell array SMCA may be referred to as a second plurality of main word lines NWL1 to NWLi.

In the embodiment illustrated in FIG. 9, each memory cell MC comprises an NMOS transistor N having a vertical channel structure and a capacitor C. Also, sense amplifier block SA comprises precharge circuits P, column selection gates CSG, and PMOS and NMOS sense amplifiers PSA and NSA. Each precharge circuit P comprises an NMOS transistor N1, and each column selection gate CSG comprises NMOS transistors N3 and N4.

In the portion of a memory cell array illustrated in FIG. 9, the bit lines have an open bit line structure, and a plurality of PMOS and NMOS sense amplifiers PSA and NSA (i.e., selected PMOS and NMOS sense amplifiers PSA and NSA) of sense amplifier block SA are interposed between sub memory cell array blocks SMCA1 that are separated along a dimension in which column selection signal line CSL extends. That is, PMOS and NMOS sense amplifiers PSA and NSA of sense amplifier block SA have a rotated sense amplifier structure.

Functions of components illustrated in FIG. 9 will be described below. Among PMOS and NMOS sense amplifiers PSA and NSA, each NMOS sense amplifier NSA amplifies one line of a corresponding sense bit line pair to a ground voltage level in response to a ground voltage level signal LAB, and each PMOS sense amplifier PSA amplifies one line of a corresponding sense bit line pair to a power voltage level in response to a power voltage level signal LA. An NMOS transistor N1 is turned ON in response to a precharge control signal VPRE, and when an NMOS transistor N1 is turned ON, the precharge circuit P in which it is disposed precharges the corresponding bit line to a precharge voltage level VBL. In addition, each bit line is precharged at both sides of the bit line by two NMOS transistors N1, respectively. Precharge voltage level VBL may be a voltage between the power voltage and the ground voltage. NMOS transistors N3 and N4 are turned ON in response to column selection signal CSL, and when a pair of NMOS transistors N3 and N4 are turned ON, the column selection gate CSG comprising the pair of NMOS transistors N3 and N4 transmits data between a corresponding sense bit line pair and a corresponding data line pair. Each of a first plurality of drivers D drives power voltage level signal LA applied to PMOS sense amplifier PSA and each of a second plurality of drivers D drives ground voltage level signal LAB applied to NMOS sense amplifier NSA.

Figure 1A:
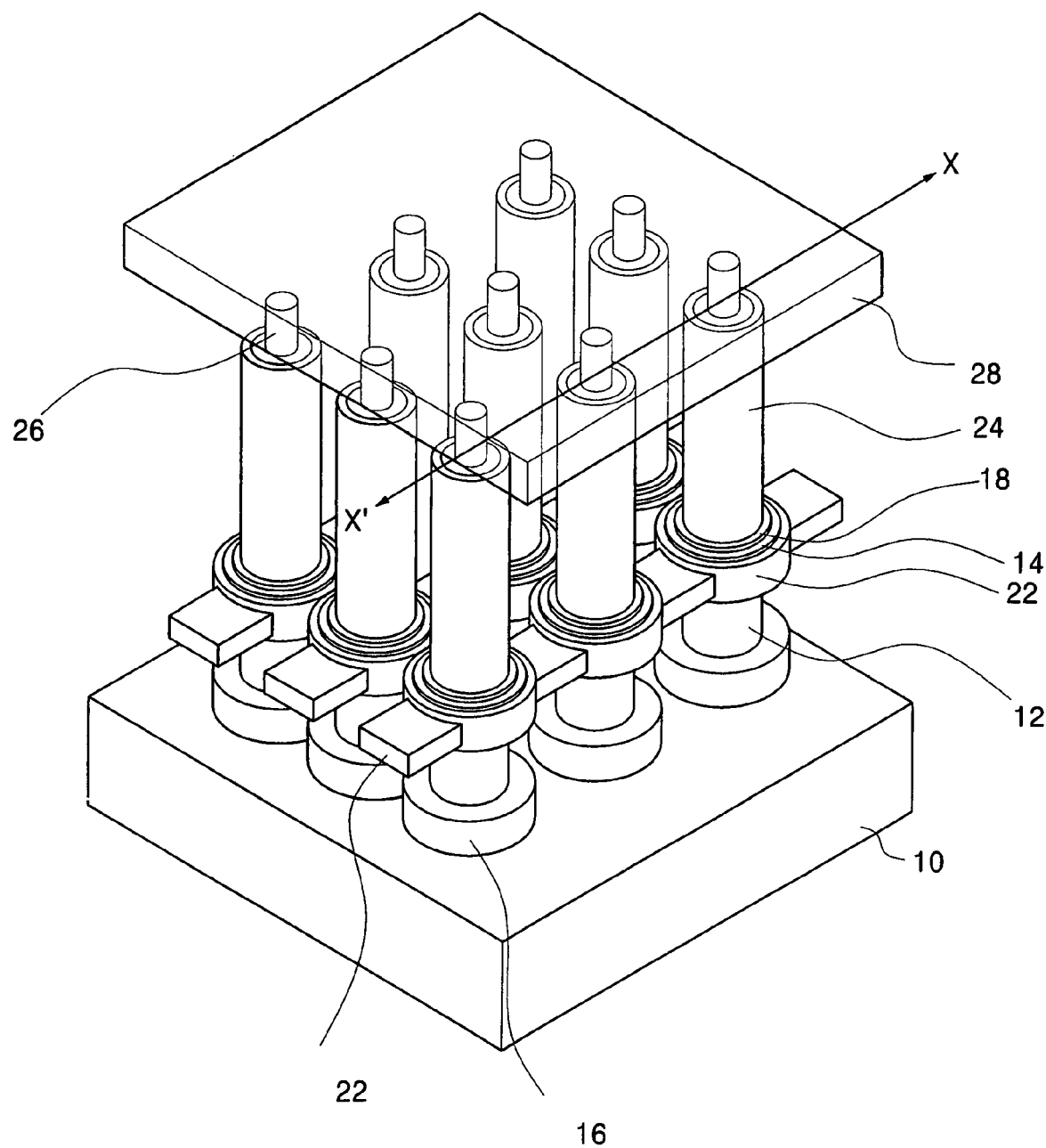
FIGS. 1A and 1B illustrate a conventional structure of dynamic memory cells each including a transistor having a vertical channel structure.
Figure 1B:
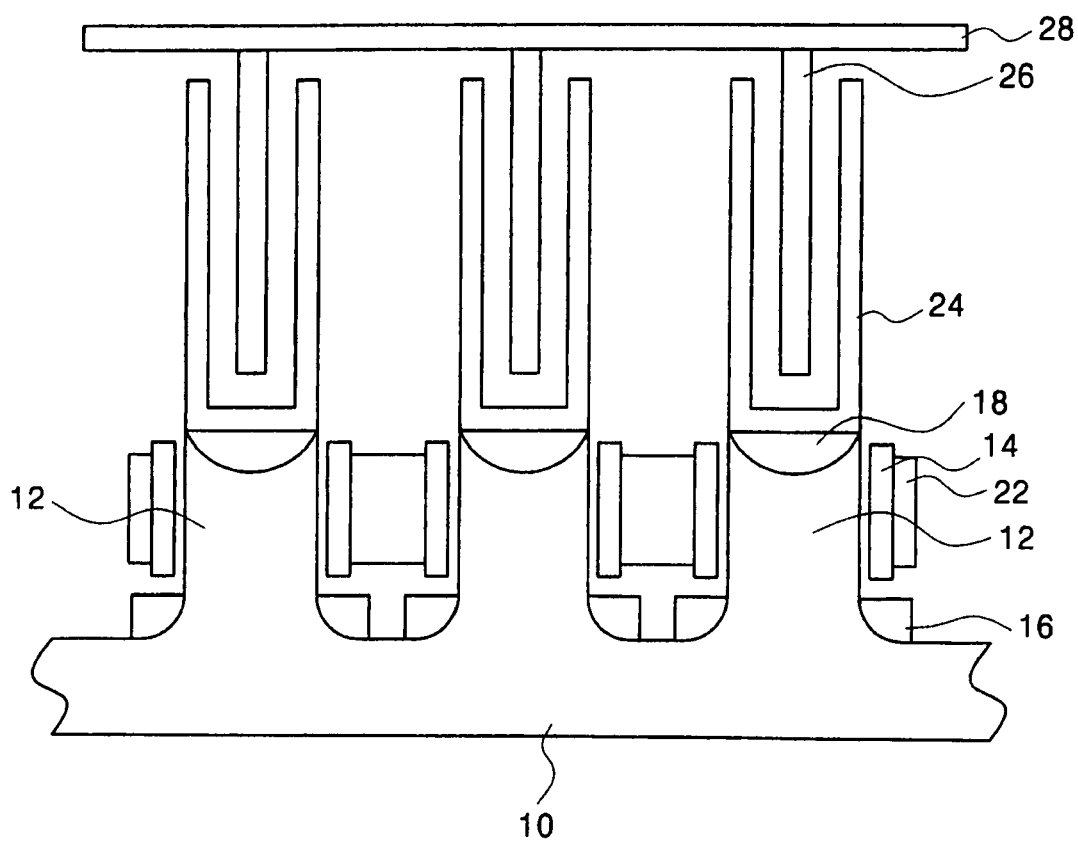
Figure 1C:
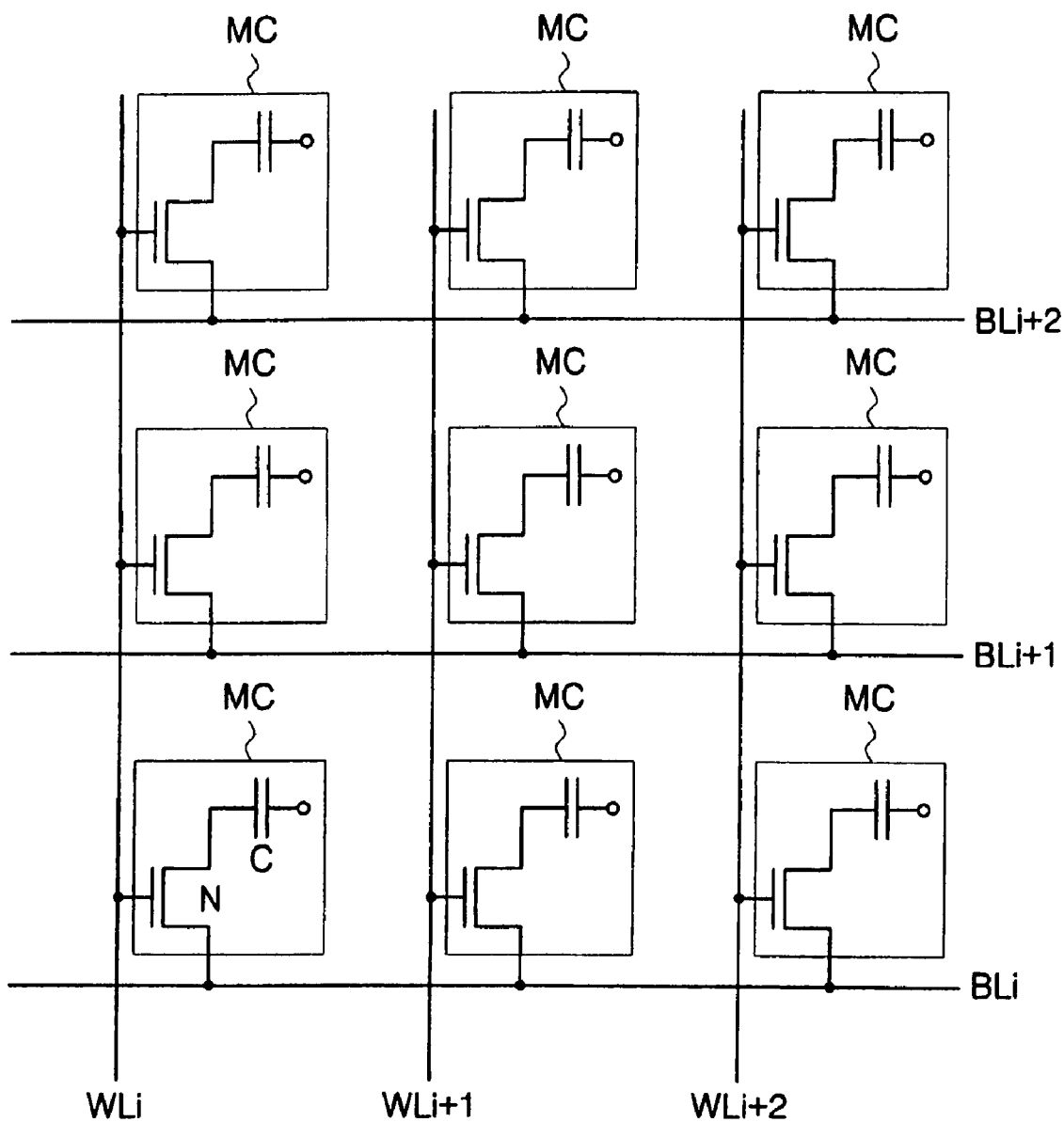
FIG. 1C illustrates an equivalent circuit of the structures illustrated in FIGS. 1A and 1B.

In each of the memory cell array blocks partially illustrated in FIGS. 7 and 9, respectively, a main word line crosses the top of sub memory cell array blocks SMCA1 to SMCAk and is perpendicular to the column selection signal line. In addition, divided word lines are connected to the main word line and are disposed in the sub memory cell array blocks SMCA1 to SMCAk. As an example, a word line having the same structure as word line 22 of FIG. 1A may be a divided word line, and the main word line may be disposed on the top of electrode 28 of FIG. 1A. The divided word line and the main word line are connected through a contact technique in a semiconductor fabrication process.

The memory cell array partially illustrated in each of FIGS. 7 and 9 can rapidly drive the word line to a desired level because the word line has a relatively low parasitic resistance. The memory cell array can also rapidly precharge the bit line to a precharge level even if the parasitic resistance of the bit line is relatively high because the bit line is precharged at both sides of the sub memory cell array SMCA.

Also, since the PMOS and NMOS sense amplifiers of the memory cell array partially illustrated in each of FIGS. 7 and 9 have a rotated sense amplifier structure, the areas of the regions in which the amplifiers are disposed are reduced. However, these amplifiers need not have the rotated sense amplifier structure, but may alternately be disposed on a one for one basis between the sub memory cell array blocks. That is, the amplifiers may have a common sense amplifier structure. Moreover, the memory cell array partially illustrated in each of FIGS. 7 and 9 does not include an additional transistor located between the bit line pair BL and BLB to reduce bit line loading effects. Thus, in contrast to some conventional precharge circuits, the precharge circuit according to an embodiment of the invention need not include this type transistor designed to reduce bit line loading.

Figure 11:
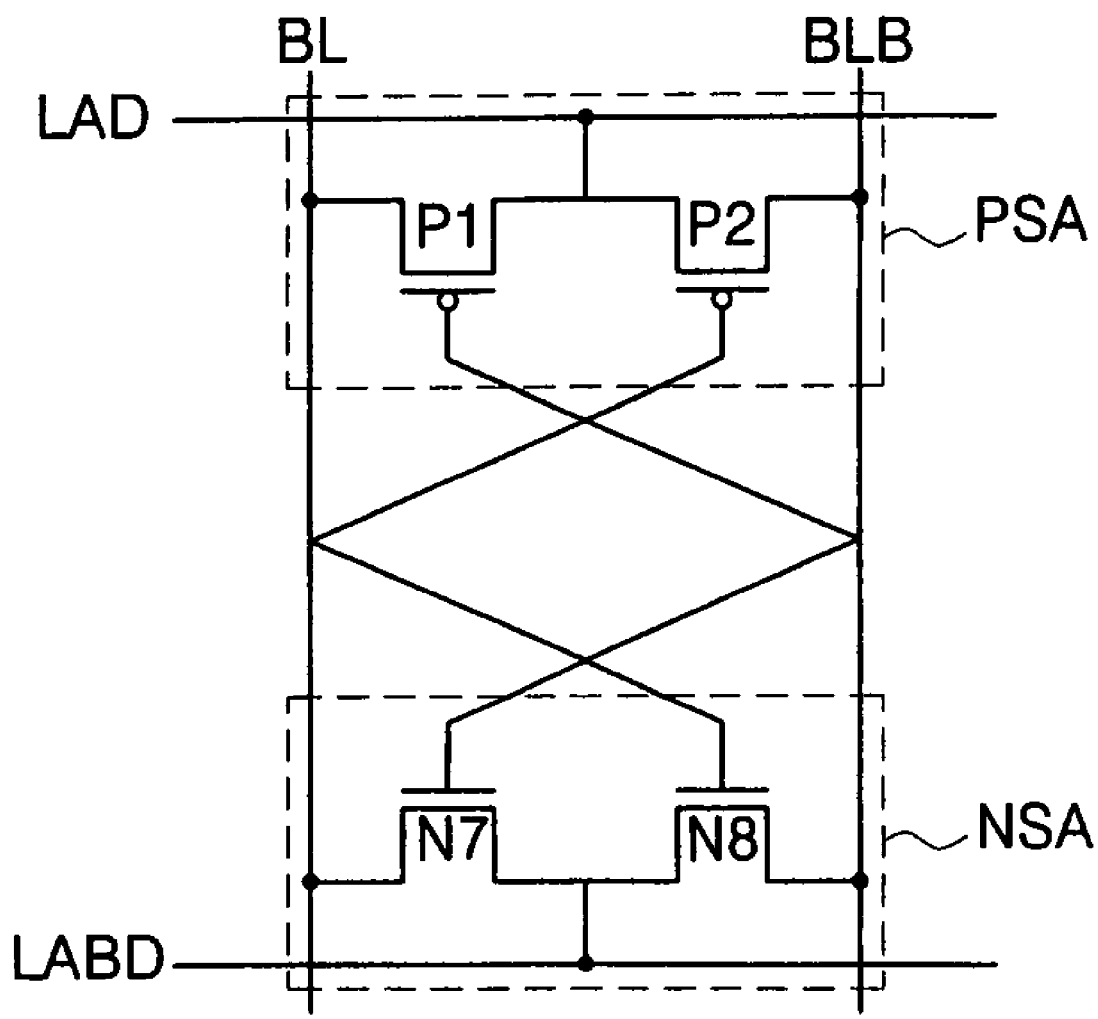
FIG. 11 illustrates PMOS and NMOS sense amplifiers of FIGS. 7 and 9 in more detail; and, FIG. 12 illustrates an arrangement of components of a sense amplifier block of the semiconductor memory devices partially illustrated in FIGS. 7 and 9, respectively.

FIG. 11 illustrates PMOS and NMOS sense amplifiers PSA and NSA of FIGS. 7 and 9 in more detail. As illustrated in FIG. 11, PMOS sense amplifier PSA comprises PMOS transistors P1 and P2 and NMOS sense amplifier NSA comprises NMOS transistors N7 and N8.

Functions of the sense amplifiers illustrated in FIG. 11 will be described below. When a power voltage level signal LAD is applied to PMOS sense amplifier PSA, a voltage difference between the individual bit lines of bit line pair BL and BLB is amplified. In particular, when power voltage level signal LAD is applied to PMOS sense amplifier PSA, PMOS sense amplifier PSA senses a logic low level signal from one of the bit lines of bit line pair BL and BLB and uses the logic low level signal in amplifying a logic high level signal of the other bit line of bit line pair BL and BLB to a power voltage level. Also, when a ground voltage level signal LABD is applied to NMOS sense amplifier NSA, a voltage difference between the individual bit lines of bit line pair BL and BLB is amplified. In particular, when a ground voltage level signal LABD is applied to NMOS sense amplifier NSA, NMOS sense amplifier NSA senses a logic high level signal from one of the bit lines of bit line pair BL and BLB and uses the logic high level signal in amplifying a logic low level signal of the other bit line of bit line pair BL and BLB to a ground voltage level. Thus, sense amplifier blocks SA of FIGS. 7 and 9 comprising PMOS and NMOS sense amplifiers PSA and NSA each sense and amplify a voltage difference between a bit line and an inverted bit line of a bit line pair.

The sense amplifier illustrated in FIG. 11 may have the rotated sense amplifier structure illustrated in FIGS. 7 and 9 or a conventional sense amplifier structure.

Figure 10:
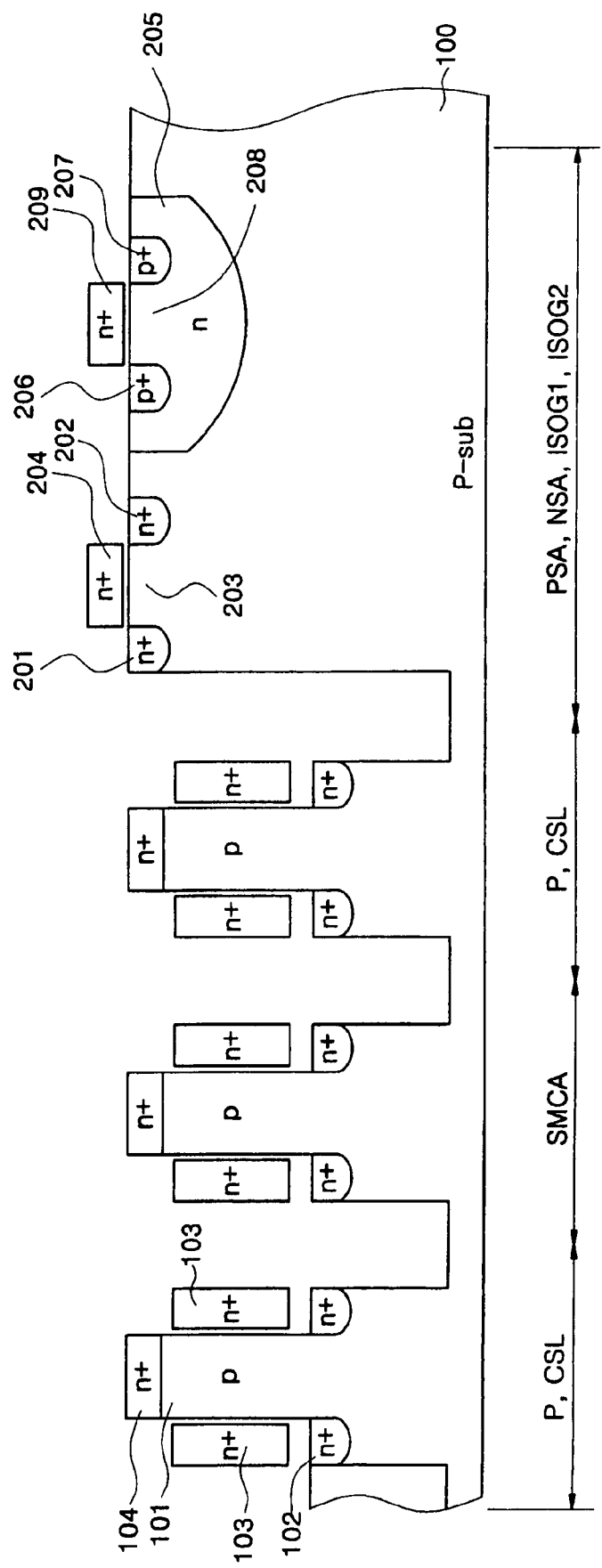
FIG. 10 illustrates respective structures of transistors of various parts of the memory cell arrays partially illustrated in FIGS. 7 and 9, respectively.

FIG. 10 illustrates respective structures of transistors of various parts of the memory cell arrays partially illustrated in FIGS. 7 and 9, respectively. NMOS transistors N of memory cells MC disposed in sub memory cell array SMCA, NMOS transistors N1 of precharge circuits P, and NMOS transistors N3 and N4 of column selection gates CSG each have a vertical channel structure. However, PMOS transistors of PMOS sense amplifiers PSA, NMOS transistors of NMOS sense amplifiers NSA, and PMOS and NMOS transistors of isolation gates ISOG1 and ISOG2 all have a horizontal channel structure.

An NMOS transistor having a vertical channel structure comprises a P-type channel 101 formed on a P-type semiconductor substrate 100, an N+-type source/drain region 102 formed in P-type semiconductor substrate 100 below P-type channel 101 (i.e., under P-type channel 101), an N+-type gate 103 surrounding and insulated from P-type channel 101, and a source/drain region 104 formed on P-type channel 101. As used herein, when a source/drain region is said to be formed "below" a P-type channel, it means that the source/drain region is disposed lower than the P-type channel relative to the working surface of the substrate where the P-type channel is formed. In addition, as used herein, a source, a drain, and a source/drain region may each be referred to as a "terminal".

The NMOS transistor having the horizontal channel structure comprises an N+-type source/drain region 201 and an N+-type source/drain region 202, which are each disposed in P-type semiconductor substrate 100 and separated from one another, a P-type channel 203 disposed between source/drain regions 201 and 202, and an N+-type gate 204 formed on P-type channel 203 and insulated from P-type channel 203.

In addition, the PMOS transistor having the horizontal channel structure comprises an N-well 205 disposed in P-type semiconductor substrate 100, a P+-type source/drain region 206 and a P+-type source/drain region 207 disposed in N-well 205 and separated from one another, an N-type channel 208 disposed between source/drain regions 206 and 207, and an N+-type gate 209 disposed on and insulated from N-type channel 208.

Because the NMOS transistors of sub memory cell array SMCA, precharge circuit P, and column selection gate CSL each have a vertical channel structure, as illustrated in FIG. 10, these transistors may be disposed in a smaller area in a semiconductor memory device in accordance with an embodiment of the invention than a semiconductor memory device using conventional transistors each having a horizontal channel structure.

If needed, all transistors of a sense amplifier block SA corresponding to a memory cell array (except the PMOS and NMOS sense amplifiers PSA and NSA of sense amplifier block SA) may be transistors having a vertical channel structure (not illustrated). If that is the case in a semiconductor memory device, since a negative voltage (for example, −0.2V) is a threshold voltage of an NMOS transistor having the vertical channel structure, a substrate voltage VBB that is lower than the threshold voltage is applied to turn OFF precharge circuit P, like the driver of the word line driver, and a high voltage VPP is applied to completely turn ON precharge circuit P.

Figure 12:
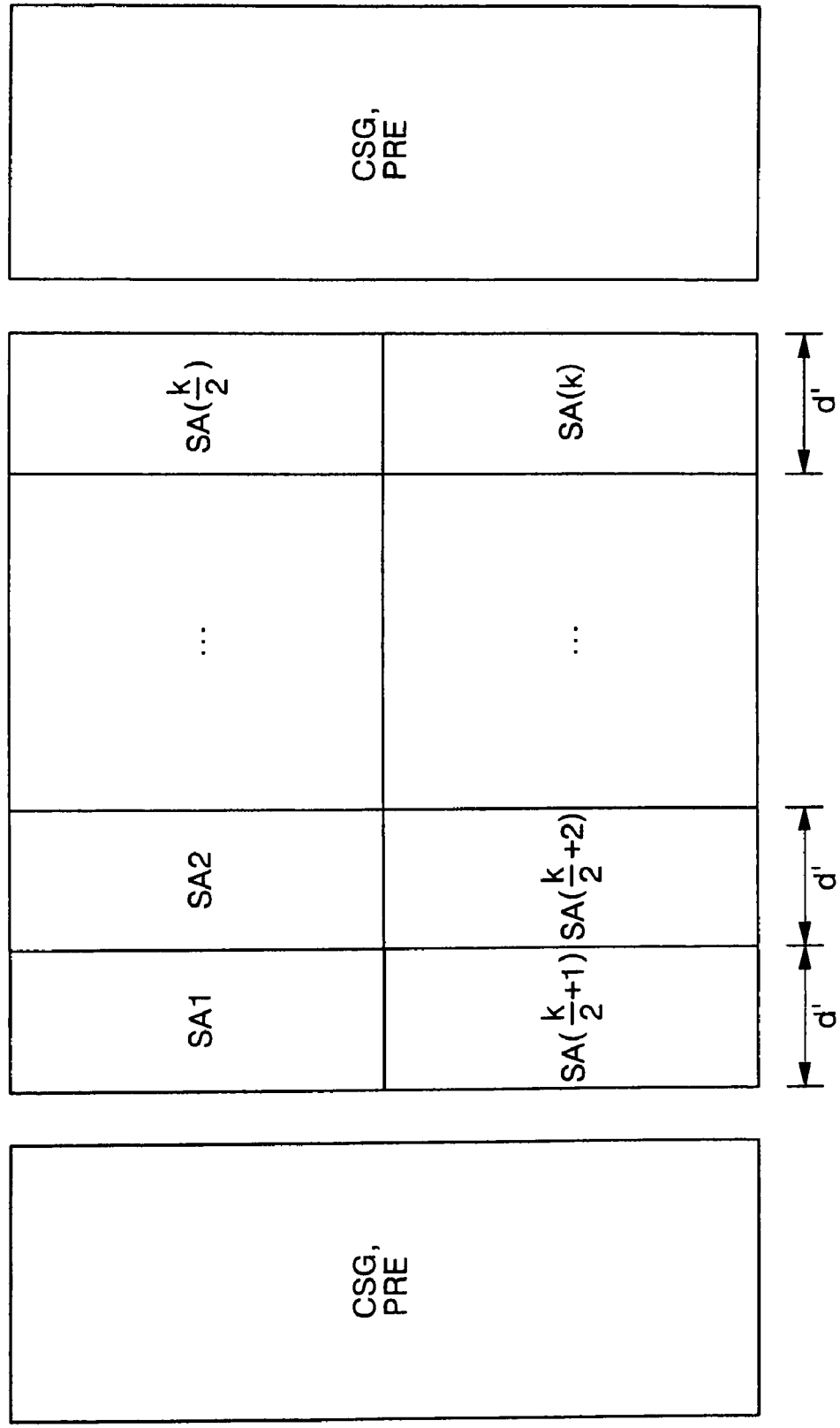

FIG. 12 illustrates an arrangement of components of a sense amplifier block of the semiconductor memory device partially illustrated in FIGS. 7 and 9. In particular, FIG. 12 illustrates an arrangement of components of a sense amplifier block having a rotated sense amplifier block structure with respect to k bit line pairs BL1 and BL1B to BLk and BLkB. Sense amplifiers SA1 to SAk are respectively connected to bit line pairs BL1 and BL1B to BLk and BLkB. In the sense amplifier block of FIG. 12, column selection gates CSG and precharge blocks PRE are disposed at both sides of sense amplifier block SA, and sense amplifiers SA1 to SAk are disposed in rows of k/2 sense amplifiers, wherein a first row comprises sense amplifiers SA1 to SA(k/2) and a second row comprises SA(k/2+1) to SAk.

Figure 3:
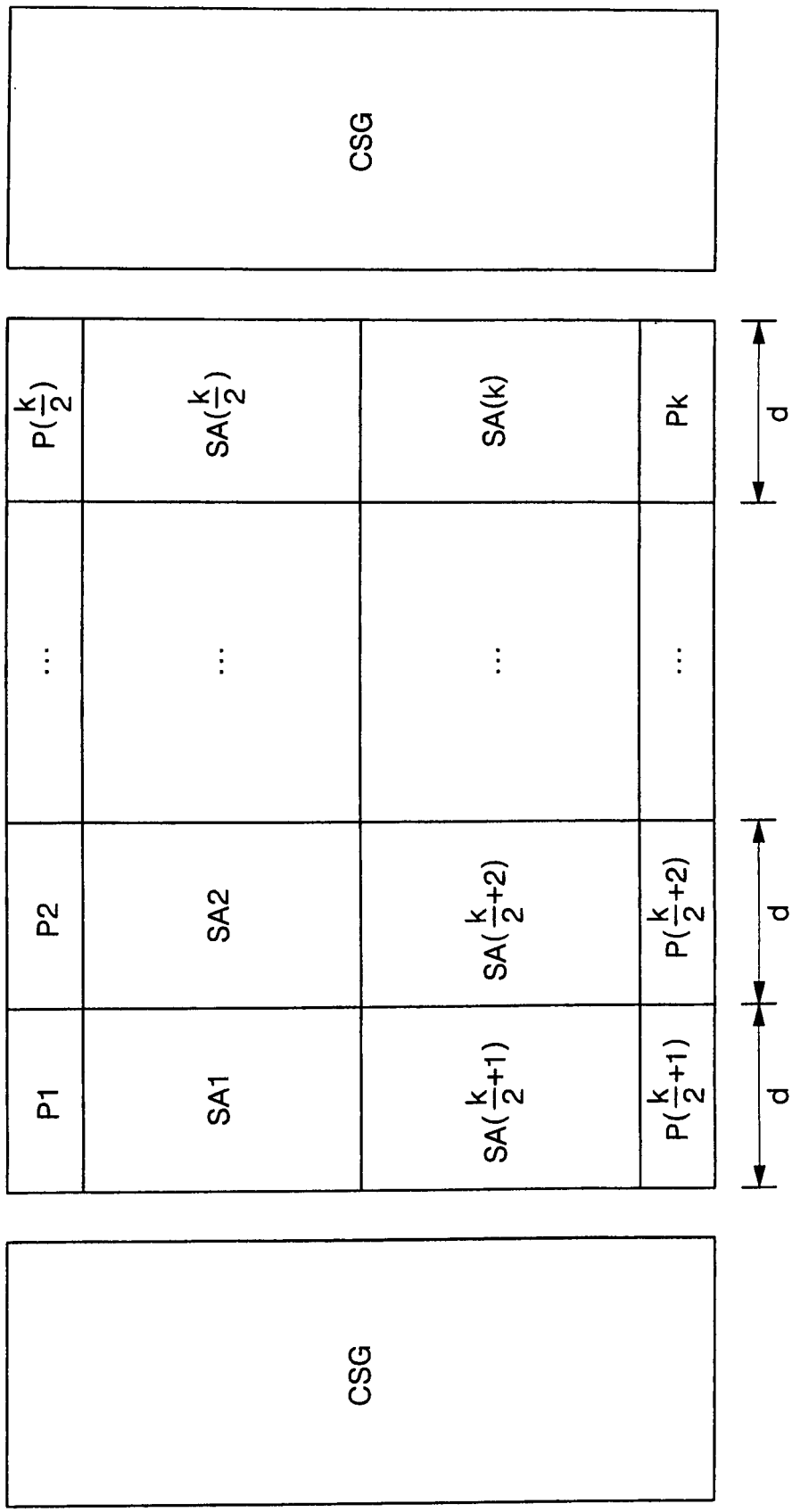
FIG. 3 illustrates an exemplary arrangement of components of a sense amplifier block of FIG. 2.

When the sense amplifier block of the semiconductor memory device partially illustrated in FIGS. 7 and 9 has the rotated sense amplifier structure, column selection gates CSG and precharge blocks PRE are disposed at both sides of the sense amplifier block, so a first-dimensional length d' of a region in which one of sense amplifiers SA1 to SAk is disposed can be reduced relative to first-dimensional length d of FIG. 3. That is, in the sense amplifier block of FIG. 3, the respective first-dimensional lengths of the regions in which sense amplifiers SA1 to SAk are disposed are controlled by the respective first-dimensional lengths of the regions in which precharge circuits P1 to Pk are disposed, which thereby restrict the reduction of the size of sense amplifier block SA through reduction of the respective first-dimensional lengths of the regions in which sense amplifiers SA1 to SAk are disposed. However, because, in the sense amplifier block of FIG. 12, precharge blocks PRE are disposed separately from sense amplifiers SA1 to SAk, the respective first-dimensional lengths of the regions in which sense amplifiers SA1 to SAk are disposed can be reduced from d to d' (where d'<d) with a corresponding reduction in the first-dimensional length of the region in which all of sense amplifiers SA1 to SAk are disposed. In addition, since the respective second-dimensional lengths of the respective regions in which sense amplifiers SA1 to SAk are disposed increases relative to the same lengths in the sense amplifier block of FIG. 3, the transistors in sense amplifiers SA1 to SAk may be larger than in the sense amplifier block of FIG. 3. Thus, performance of sense amplifiers SA1 to SAk may improve. In addition, as used herein, the second dimension is orthogonal to the first dimension.

Since the NMOS transistors of column selection gate CSG and precharge block PRE of the sense amplifier block illustrated in FIG. 12 are formed having a vertical channel structure as illustrated in FIG. 10, the areas of the column selection gate CSG and precharge block PRE are smaller than in the conventional sense amplifier block of FIG. 3. Thus, the area of the entire of the region in which the sense amplifier block of FIG. 12 is disposed is smaller than the area of the region in which the sense amplifier block of FIG. 3 is disposed.

In a semiconductor memory device in accordance with an embodiment of the invention, since the semiconductor memory device comprises memory cells using transistors having a vertical channel structure, parasitic resistance of a word line and a bit line increase. However, operational characteristics of the semiconductor memory device do not substantially deteriorate because (i.e., at least in part because) the bit line is precharged at two sides of the bit line.

Also, in a semiconductor memory device in accordance with an embodiment of the invention, since the sense amplifier has a rotated sense amplifier structure, and the transistors constituting a column selection gate and a precharge circuit have a vertical channel structure, the sense amplifier may be disposed in a smaller area than a conventional sense amplifier block.

Although embodiments of the invention have been described herein, modifications may be made to the embodiments by one skilled in the art without departing from the scope of the invention as defined by the accompanying claims.

What is claimed is:

1. A semiconductor memory device, comprising:
a first sub memory cell array including a plurality of first memory cells connected between a plurality of first word lines and a plurality of bit lines, the plurality of first memory cells each including at least one transistor having a vertical channel structure;
a second sub memory cell array including a plurality of second memory cells connected between a plurality of second word lines and a plurality of inverted bit lines, the plurality of second memory cells each including at least one transistor having a vertical channel structure; and
a precharge portion disposed at both sides of each bit line and each inverted bit line and precharging each bit line and each inverted bit line to a precharge voltage level at both sides thereof in response to a precharge control signal,
wherein each of the plurality of bit lines and the plurality of inverted bit lines is extended in a bit line direction, and the first memory cell array and the second memory cell array are arranged in the bit line direction,
wherein the precharge portion includes
first and second precharge blocks disposed at first and second sides of a first bit line of the plurality of bit lines, respectively, wherein the first and second precharge blocks precharge the first bit line to a precharge voltage level at the first and second sides of the first bit line, respectively, in response to the precharge control signal, and
third and fourth precharge blocks disposed at first and second sides of a first inverted bit line of the plurality of inverted bit lines, respectively, wherein the third and fourth precharge blocks precharge the first inverted bit line to the precharge voltage level at the first and second sides of the first inverted bit line, respectively, in response to the precharge control signal.

2. The device according to claim 1, further comprising:
a data input/output gate for transmitting data between a plurality of bit line pairs respectively made up of a bit line and a corresponding inverted bit line, and a predetermined number of data input/output line pairs; and
a sense amplifier portion for sensing and amplifying a voltage difference between the bit line and inverted bit line in each bit line pair.

3. The device according to claim 1, wherein
the first precharge block comprises a first NMOS transistor, the first NMOS transistor disposed at one side of the first sub memory cell array and having a vertical channel structure including a drain connected to a respective bit line, a gate to which a precharge control signal is applied, and a source to which a precharge voltage is applied;
the second precharge block comprises a second NMOS transistor, the second NMOS transistor disposed at the other side of the first sub memory cell array and having a vertical channel structure including a drain connected to a respective inverted bit line, a gate to which the precharge control signal is applied, and a source to which the precharge voltage is applied;
the third precharge block comprises a third NMOS transistor, the third NMOS transistor disposed at one side of the second sub memory cell array and having a vertical channel structure including a drain connected to a respective inverted bit line, a gate to which the precharge control signal is applied, and a source to which the precharge voltage is applied; and
the fourth precharge block comprises a fourth NMOS transistor, the fourth NMOS transistor disposed at the other side of the second sub memory cell array and having a vertical channel structure including a drain connected to a respective inverted bit line, a gate to which the precharge control signal is applied, and a source to which the precharge voltage is applied.

4. The device according to claim 2, wherein the data input/output gate comprises:
a fifth NMOS transistor having a vertical channel structure including a gate to which a column selection signal is applied, and a source (drain) and a drain (source) respectively connected to one of the bit lines of and one of the data input/output lines; and
a sixth NMOS transistor having a vertical channel structure including a gate to which the column selection signal is applied, and a source (drain) and a drain (source) respectively connected to one of the inverted bit lines and one of the inverted data input/output lines.

5. The device according to claim 1, wherein each of the plurality of word lines comprises:
a main word line; and
a predetermined number of divided word lines connected to the main word line.

6. The device according to claim 3, wherein the transistor having the vertical channel structure, and the first to fourth NMOS transistors having the vertical channel structure, comprise a p-type channel formed perpendicular to a semiconductor substrate, an n+-type source and drain formed in the semiconductor substrate under the p-type channel, an n+-type gate surrounding and insulated from the p-type channel, and an n+-type drain and source formed on top of the channel, respectively.

7. The device according to claim 4, wherein the fifth and sixth NMOS transistors having the vertical channel structure comprise a p-type channel formed perpendicular to a semiconductor substrate, an n+-type source and drain formed in the semiconductor substrate under the p-type channel, an n+-type gate surrounding and insulated from the p-type channel, and an n+-type drain and source formed on top of the channel, respectively.

8. The device according to claim 2, wherein the sense amplifier portion comprises a plurality of sense amplifiers, and the first and second word lines are perpendicular to the bit line pairs, the first and second sub memory cell arrays are disposed in the same direction as the bit line pairs, and a predetermined number of the sense amplifiers are disposed in the same direction as the bit line pairs between the first memory cell array block and the second memory cell array block.

9. The device according to claim 8, wherein the precharge portion and the data input/output gate are disposed at both sides of a region in which the sense amplifier portions are disposed.

10. A semiconductor memory device, comprising:
a memory cell array including a first sub memory cell array including a plurality of first memory cells connected between a plurality of first word lines and a plurality of bit lines, the plurality of first memory cells each including at least one transistor having a vertical channel structure, a second sub memory cell array including a plurality of second memory cells connected between a plurality of second word lines and a plurality of inverted bit lines, the plurality of second memory cells each including at least one transistor having a vertical channel structure, and a precharge portion disposed at both sides of each bit line and inverted bit line and precharging the bit lines and inverted bit lines to a precharge voltage level at both sides thereof in response to a precharge control signal, wherein each of the plurality of bit lines and the plurality of inverted bit lines is extended in a bit line direction, and the first memory cell array and the second memory cell array are arranged in the bit line direction; and
a row address decoder and a word line driver which generate a decoded row address signal by decoding a row address, input the decoded row address signal, and drive main word lines,
wherein the precharge portion comprises includes
first and second precharge blocks disposed at first and second sides of a first bit line of the plurality of bit lines, respectively, wherein the first and second precharge blocks precharge the first bit line to a precharge voltage level at the first and second sides of the first bit line, respectively, and
third and fourth precharge blocks disposed at first and second sides of a first inverted bit line of the plurality of inverted bit lines, respectively, wherein the third and fourth precharge blocks precharge the first inverted bit line to the precharge voltage level at the first and second sides of the first inverted bit line, respectively.

11. The device according to claim 10, wherein the row address decoder and the word line driver are disposed in the same direction as the bit line at one side of the memory cell array.

12. The device according to claim 10, wherein the row address decoder and the word line driver are disposed in the same direction as the bit line in the center of the memory cell array.

13. The device according to claim 10, wherein the memory cell array further comprises a junction for driving a signal applied to the sense amplifier portion between the sense amplifier portions disposed in the same direction as the word line.

14. The device according to claim 10, wherein the memory cell array further comprises:
a data input/output gate for transmitting data between a plurality of bit line pairs made up of one of the bit lines and a corresponding one of the inverted bit lines, and a predetermined number of data input/output line pairs; and
a sense amplifier portion for sensing and amplifying a voltage difference between the bit line and inverted bit line of each bit line pair.

15. The device according to claim 10, wherein
the first precharge block comprises a first NMOS transistor, the first NMOS transistor disposed at one side of the first sub memory cell array and having a vertical channel structure including a drain connected to one of the bit lines, a gate to which a precharge control signal is applied, and a source to which a precharge voltage is applied;
the second precharge block comprises a second NMOS transistor, the second NMOS transistor disposed at the other side of the first sub memory cell array and having a vertical channel structure including a drain connected to one of the inverted bit lines, a gate to which the precharge control signal is applied, and a source to which the precharge voltage is applied;
the third precharge block comprises a third NMOS transistor, the third NMOS transistor disposed at one side of the second sub memory cell array and having a vertical channel structure including a drain connected to one of the inverted bit lines, a gate to which the precharge control signal is applied, and a source to which the precharge voltage is applied; and
the fourth precharge block comprises a fourth NMOS transistor, the fourth NMOS transistor disposed at the other side of the second sub memory cell array and having a vertical channel structure including a drain connected to one of the inverted bit lines, a gate to which the precharge control signal is applied, and a source to which the precharge voltage is applied.

16. The device according to claim 10, further comprising a column decoder for decoding a column address and generating column selection signals driving column selection signal lines,
wherein the memory cell array further comprises a data input/output gate for transmitting data between bit line pairs made up of one of the bit lines and a corresponding one of the inverted bit lines, and a predetermined number of data input/output line pairs, in response to the column selection signals.

17. The device according to claim 16, wherein the data input/output gate comprises:
- a first NMOS transistor having a vertical channel structure including a gate to which the column selection signal is applied, and a source (drain) and a drain(source) respectively connected to one of the bit lines and one of the data input/output lines; and
- a second NMOS transistor having a vertical channel structure including a gate to which the column selection signal is applied, and a source (drain) and a drain (source) respectively connected to one of the inverted bit lines and one of the inverted data input/output lines.

18. The device according to claim 10, wherein the plurality of first word lines and the plurality of second word lines of the first and second memory cell arrays are divided into groups of a predetermined number and each group is connected to a corresponding one of the main word lines.

19. The device according to claim 15, wherein the transistor having the vertical channel structure, and the first to fourth NMOS transistors having the vertical channel structure, comprise a p-type channel formed perpendicular to a semiconductor substrate, an n+-type source and drain formed in the semiconductor substrate under the p-type channel, an n+-type gate surrounding and insulated from the p-type channel, and an n+-type drain and source formed on top of the channel, respectively.

20. The device according to claim 17, wherein the first and second NMOS transistors having the vertical channel structure comprise a p-type channel formed perpendicular to a semiconductor substrate, an n+-type source and drain formed in the semiconductor substrate under the p-type channel, an n+-type gate surrounding and insulated from the p-type channel, and an n+-type drain and source formed on top of the channel, respectively.

21. The device according to claim 14, wherein the sense amplifier portion comprises a plurality of sense amplifiers, a predetermined number of which are disposed in the bit line direction between the second precharge block and the third precharge block.

22. The device according to claim 21, wherein the precharge portion and the data input/output gate are disposed at both sides of a region in which the sense amplifier portion is disposed.

* * * * *